(12) United States Patent
Mizutani

(10) Patent No.: US 9,958,785 B2
(45) Date of Patent: *May 1, 2018

(54) EXPOSURE APPARATUS, EXPOSURE METHOD, AND METHOD FOR PRODUCING DEVICE

(71) Applicant: NIKON CORPORATION, Tokyo (JP)

(72) Inventor: Takeyuki Mizutani, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 95 days.

This patent is subject to a terminal disclaimer.

(21) Appl. No.: 14/145,136

(22) Filed: Dec. 31, 2013

(65) Prior Publication Data

US 2014/0111783 A1 Apr. 24, 2014

Related U.S. Application Data

(63) Continuation of application No. 11/662,729, filed as application No. PCT/JP2005/017163 on Sep. 16, 2005, now Pat. No. 8,675,174.

(30) Foreign Application Priority Data

Sep. 17, 2004 (JP) ................................. 2004-271635
Sep. 22, 2004 (JP) ................................. 2004-274990

(51) Int. Cl.
*G03B 27/42* (2006.01)
*G03F 7/20* (2006.01)

(52) U.S. Cl.
CPC .......... *G03F 7/70341* (2013.01); *G03F 7/709* (2013.01)

(58) Field of Classification Search
CPC .. G03F 7/70341; G03F 7/709; G03F 7/70825; G03F 7/70833; G03F 7/2041
(Continued)

(56) References Cited

U.S. PATENT DOCUMENTS 4,346,164 A 8/1982 Tabarelli et al.
4,480,910 A 11/1984 Takanashi et al.
(Continued)

FOREIGN PATENT DOCUMENTS

CN 1501173 A 6/2004
DE 221 563 A1 4/1985
(Continued)

OTHER PUBLICATIONS

Dec. 23, 2013 Office Action issued in Indian Application No. 926/KOLNP/2007.
(Continued)

*Primary Examiner* — Christina Riddle
(74) *Attorney, Agent, or Firm* — Oliff PLC

(57) ABSTRACT

An exposure apparatus includes a nozzle member which has at least one of a supply port for supplying a liquid and a recovery port for recovering the liquid, and a nozzle adjusting mechanism which adjusts at least one of a position and a posture of the nozzle member depending on a position or a posture of a substrate. The exposure apparatus forms an immersion area of the liquid on the substrate, and performs exposure for the substrate through the liquid in the immersion area. Accordingly, the liquid is satisfactorily retained between the projection optical system and the substrate, thereby making it possible to realize the exposure highly accurately.

9 Claims, 16 Drawing Sheets

(58) Field of Classification Search
USPC .......... 355/30, 52, 53, 55, 67–74, 77; 430/5, 430/311, 312, 313; 250/492.1, 492.2, 250/492.22, 548
See application file for complete search history.

(56) References Cited

U.S. PATENT DOCUMENTS

| | | | |
|---|---|---|---|
| 4,666,273 | A | 5/1987 | Shimizu et al. |
| 5,357,304 | A | 10/1994 | Wakamiya et al. |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,874,820 | A | 2/1999 | Lee |
| 5,969,441 | A | 10/1999 | Loopstra et al. |
| 6,208,407 | B1 | 3/2001 | Loopstra |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,710,849 | B2 | 3/2004 | Kwan et al. |
| 6,778,257 | B2 | 8/2004 | Bleeker et al. |
| 6,867,844 | B2 | 3/2005 | Vogel et al. |
| 7,053,983 | B2 | 5/2006 | Tokita |
| 2004/0165159 | A1 | 8/2004 | Lof et al. |
| 2004/0263809 | A1 | 12/2004 | Nakano |
| 2005/0007569 | A1 | 1/2005 | Streefkerk et al. |
| 2005/0018155 | A1 | 1/2005 | Cox et al. |
| 2005/0036121 | A1 | 2/2005 | Hoogendam et al. |
| 2005/0088635 | A1 | 4/2005 | Hoogendam et al. |
| 2005/0094125 | A1 | 5/2005 | Arai |
| 2005/0128445 | A1 | 6/2005 | Hoogendam et al. |
| 2005/0134815 | A1 | 6/2005 | Van Santen et al. |
| 2005/0254026 | A1 | 11/2005 | Tokita |
| 2005/0259233 | A1 | 11/2005 | Streefkerk et al. |
| 2005/0259234 | A1 | 11/2005 | Hirukawa et al. |
| 2005/0270506 | A1 | 12/2005 | Streefkerk et al. |
| 2006/0023182 | A1 | 2/2006 | Novak et al. |
| 2006/0023189 | A1 | 2/2006 | Lof et al. |
| 2006/0028632 | A1 | 2/2006 | Hazelton et al. |
| 2006/0098177 | A1 | 5/2006 | Nagasaka |
| 2006/0119807 | A1* | 6/2006 | Baselmans ................ 355/30 |
| 2006/0119820 | A1 | 6/2006 | Hirukawa |
| 2006/0126045 | A1 | 6/2006 | Ono et al. |
| 2006/0132738 | A1 | 6/2006 | Hirukawa |
| 2006/0139593 | A1 | 6/2006 | Nagasaka et al. |
| 2006/0164615 | A1 | 7/2006 | Hirukawa |
| 2006/0170891 | A1 | 8/2006 | Nishinaga et al. |
| 2006/0181690 | A1 | 8/2006 | Nishinaga et al. |
| 2006/0209278 | A1 | 9/2006 | Kiuchi et al. |
| 2006/0215131 | A1 | 9/2006 | Van Der Toorn et al. |
| 2006/0232753 | A1 | 10/2006 | Khmelichek et al. |
| 2006/0250593 | A1 | 11/2006 | Nishii |
| 2007/0115447 | A1 | 5/2007 | Hirukawa et al. |
| 2007/0115448 | A1 | 5/2007 | Hirukawa et al. |
| 2007/0164234 | A1 | 7/2007 | Tsuji et al. |
| 2007/0258064 | A1 | 11/2007 | Hirukawa |
| 2007/0263188 | A1 | 11/2007 | Hara |
| 2007/0263196 | A1 | 11/2007 | Hirukawa et al. |
| 2008/0151203 | A1 | 6/2008 | Hirukawa et al. |
| 2009/0015807 | A1 | 1/2009 | Hirukawa et al. |
| 2009/0033905 | A1 | 2/2009 | Streefkerk et al. |
| 2010/0091255 | A1 | 4/2010 | Streefkerk et al. |
| 2011/0051106 | A1 | 3/2011 | Hirukawa et al. |

FOREIGN PATENT DOCUMENTS

| | | | |
|---|---|---|---|
| DE | 224 448 | A1 | 7/1985 |
| EP | 1 571 697 | A1 | 8/2003 |
| EP | 1 420 298 | A2 | 5/2004 |
| EP | 1 598 855 | A1 | 11/2005 |
| EP | 1 632 991 | A1 | 3/2006 |
| JP | A 58-202448 | | 11/1983 |
| JP | A 59-019912 | | 2/1984 |
| JP | A 60-078454 | | 5/1985 |
| JP | A 62-065326 | | 3/1987 |
| JP | A 63-157419 | | 6/1988 |
| JP | A 4-277612 | | 10/1992 |
| JP | A 4-305915 | | 10/1992 |
| JP | A 4-305917 | | 10/1992 |
| JP | A 5-062877 | | 3/1993 |
| JP | A-6-53120 | | 2/1994 |
| JP | A 6-053120 | | 2/1994 |
| JP | A 6-124873 | | 5/1994 |
| JP | A-6-188169 | | 7/1994 |
| JP | A 6-188169 | | 7/1994 |
| JP | A 7-220990 | | 8/1995 |
| JP | A 8-037149 | | 2/1996 |
| JP | A-8-37149 | | 2/1996 |
| JP | A 8-166475 | | 6/1996 |
| JP | A-8-166475 | | 6/1996 |
| JP | A 8-316125 | | 11/1996 |
| JP | A 8-330224 | | 12/1996 |
| JP | A-8-330224 | | 12/1996 |
| JP | A 10-163099 | | 6/1998 |
| JP | A 10-214783 | | 8/1998 |
| JP | A 10-303114 | | 11/1998 |
| JP | A 10-340846 | | 12/1998 |
| JP | A 11-135400 | | 5/1999 |
| JP | A-11-135400 | | 5/1999 |
| JP | A 11-176727 | | 7/1999 |
| JP | A 2000-058436 | | 2/2000 |
| JP | A 2000-505958 | | 5/2000 |
| JP | A 2001-345245 | | 12/2001 |
| JP | A 2002-158168 | | 5/2002 |
| JP | A-2004-343114 | | 12/2004 |
| JP | A 2005-129914 | | 5/2005 |
| JP | 2005-159431 | | 6/2005 |
| JP | A 2005-159322 | | 6/2005 |
| JP | A 2005-183744 | | 7/2005 |
| JP | A 2005-191394 | | 7/2005 |
| JP | A 2005-303167 | | 10/2005 |
| JP | A-2005-303167 | | 10/2005 |
| JP | A 2005-340815 | | 12/2005 |
| WO | WO 98/28665 | | 7/1998 |
| WO | WO 99/49504 | | 9/1999 |
| WO | WO 01/35168 | A1 | 5/2001 |
| WO | WO 2004/019128 | A2 | 3/2004 |
| WO | WO 2004/053955 | | 6/2004 |
| WO | WO 2004/053955 | A1 | 6/2004 |
| WO | WO 2004/055803 | A1 | 7/2004 |
| WO | WO 2004/057589 | A1 | 7/2004 |
| WO | WO 2004/057590 | A1 | 7/2004 |
| WO | WO 2004055803 | A1 * | 7/2004 |
| WO | WO 2004/086468 | A1 | 10/2004 |
| WO | WO 2004/090634 | A2 | 10/2004 |
| WO | WO 2004/092833 | A2 | 10/2004 |
| WO | WO 2004/093159 | A2 | 10/2004 |
| WO | WO 2004/105106 | A1 | 12/2004 |
| WO | WO 2005/024517 | A2 | 3/2005 |
| WO | WO 2005/029559 | A1 | 3/2005 |
| WO | WO 2005/074606 | A2 | 8/2005 |
| WO | WO 2005/093791 | A1 | 10/2005 |
| WO | WO 2005/111722 | A2 | 11/2005 |

OTHER PUBLICATIONS

Oct. 14, 2014 Office Action issued in Taiwanese Application No. 101108426.
Japanese Office Action issued in JP Application No. 2005-269975 dated Jan. 29, 2010 (with English translation).
Notice of Allowance issued in JP Application No. 2004-274990 dated Sep. 30, 2009 (with English translation).
Australian Patent Office Examination Report issued in Singapore Patent Application No. 200701889-8 dated Mar. 13, 2008.
International Search Report issued in JP Application No. 2005-017163 dated Jan. 10, 2006.
Extended European Search Report issued in European Patent Application No. 05783623.1 dated Aug. 8, 2009.
Office Action issued in Israeli Patent Application No. 181873; dated Apr. 14, 2010; with English-language translation.

(56) References Cited

OTHER PUBLICATIONS

Jan. 10, 2006 Written Opinion of the International Searching Authority for International Application No. PCT/JP2005/017163 (with translation).
May 6, 2010 Office Action for Japanese Patent Application No. 2005-269975 (with translation).
Aug. 3, 2010 Office Action for Japanese Patent Application No. 2005-269975 (with translation).
Aug. 9, 2011 Office Action issued in European Patent Application No. 05 783 623.1.
Sep. 20, 2011 Office Action issued in Israeli Patent Application No. 181873 (with translation).
Mar. 19, 2012 Search and Examination Report issued in Singapore Patent Application No. 200906195-3.
Jun. 27, 2012 Examination Report of Taiwanese Patent Application No. 094132016 (with English-language translation).
Aug. 27, 2012 Examination Report issued in Taiwanese Patent Application No. 094132016 (with translation).
May 14, 2013 Office Action issued in Japanese Patent Application No. 2011-129203 (with translation).
Apr. 2, 2009 Office Action issued in U.S. Appl. No. 11/662,729.
Nov. 9, 2009 Office Action issued in U.S. Appl. No. 11/662,729.
Jul. 19, 2010 Office Action issued in U.S. Appl. No. 11/662,729.
Feb. 16, 2011 Office Action issued in U.S. Appl. No. 11/662,729.
Nov. 3, 2011 Office Action issued in U.S. Appl. No. 11/662,729.

* cited by examiner (A)

EXPOSURE APPARATUS, EXPOSURE METHOD, AND METHOD FOR PRODUCING DEVICE

This is a Continuation of application Ser. No. 11/662,729 filed Mar. 14, 2007. The disclosure of the prior application is hereby incorporated by reference herein in its entirety.

TECHNICAL FIELD

The present invention relates to an exposure apparatus, an exposure method, and a method for producing a device, in which a substrate is exposed through a liquid.

BACKGROUND ART

An exposure apparatus, which projects a pattern formed on a mask onto a photosensitive substrate to perform the exposure, is used in the photolithography step as one of the steps of producing microdevices such as semiconductor devices, liquid crystal display devices and the like. The exposure apparatus includes a mask stage for supporting the mask and a substrate stage for supporting the substrate. The pattern of the mask is subjected to the projection exposure onto the substrate via a projection optical system while successively moving the mask stage and the substrate stage. In the microdevice production, it is required to realize a fine and minute pattern to be formed on the substrate in order to achieve a high density of the device. In order to respond to this requirement, it is demanded to realize a higher resolution of the exposure apparatus. A liquid immersion exposure apparatus, in which the exposure process is performed in such a state that the space between the projection optical system and the substrate is filled with a liquid having a refractive index higher than that of the gas, has been contrived as one of means to realize the high resolution, as disclosed in Patent Document 1 as identified below.
PATENT DOCUMENT 1: International Publication No. 99/49504.

DISCLOSURE OF THE INVENTION

Problem to be Solved by the Invention

In the liquid immersion exposure apparatus, it is necessary that the liquid is satisfactorily retained between the projection optical system and an object (substrate and stage) arranged opposite to the projection optical system. If the liquid is not retained satisfactorily, there is such a high possibility that the liquid may outflow, the liquid may be diffused, and/or any bubble or any gas portion (void) may enter into and mix with the liquid. If the liquid outflows, for example, there is such a possibility that the outflowed liquid may be adhered to any equipment constructing the exposure apparatus to cause the malfunction of the equipment. When the equipment is any measuring instrument, there is such a possibility that the measurement accuracy of the measuring instrument may be deteriorated by the outflowed liquid. If the malfunction of the equipment and/or the deterioration of the measurement accuracy is caused as described above, the exposure accuracy of the exposure apparatus is deteriorated as well. Further, for example, if any bubble or any gas portion (void) enters into and mixes with the liquid between the projection optical system and the substrate, the pattern transfer accuracy onto the substrate is deteriorated.

In the conventional technique as described above, the liquid is supplied and recovered by using a nozzle member. However, when any vibration is generated on the nozzle member, if the vibration is transmitted, for example, to the projection optical system, then there is such a possibility that the transfer accuracy of the pattern onto the substrate, which is to be obtained via the projection optical system and the liquid, may be deteriorated.

The present invention has been made taking the foregoing circumstances into consideration, an object of which is to provide an exposure apparatus, an exposure method, and a method for producing a device using the exposure apparatus and the exposure method, wherein the liquid can be retained satisfactorily, and the exposure process can be performed accurately.

Means for Solving the Problem

In order to achieve the object as described above, the present invention adopts the following constructions.

According to a first aspect of the present invention, there is provided an exposure apparatus which exposes a substrate through a liquid of a liquid immersion area, the exposure apparatus comprising: a nozzle member which has at least one of a supply port for supplying the liquid and a recovery port for recovering the liquid; and a nozzle-adjusting mechanism which adjusts at least one of a position and an inclination of the nozzle member depending on a position of a surface of an object arranged opposite to the nozzle member.

According to the first aspect of the present invention, the liquid is retained between the nozzle member and the object. However, the nozzle-adjusting mechanism adjusts at least one of the position and the inclination of the nozzle member depending on the position of the surface (surface position) of the object. Accordingly, the positional relationship between the nozzle member and the object can be maintained in a desired state. Therefore, for example, even when the surface position of the substrate or the substrate stage as the object is changed during the exposure, at least one of the position and the inclination of the nozzle member is adjusted depending on the change of the surface position. Accordingly, the liquid is satisfactorily retained between the nozzle member and the substrate. Therefore, it is possible to suppress the outflow of the liquid and prevent the bubble and/or the gas portion or the void from entering into and mixing with the liquid. Thus, the exposure apparatus can perform the exposure process accurately.

According to a second aspect of the present invention, there is provided a method for producing a device, comprising using the exposure apparatus as defined in the foregoing aspect.

According to the second aspect of the present invention, the device can be produced in a state in which the high exposure accuracy is maintained. Therefore, it is possible to produce the device which exhibits the desired performance.

According to a third aspect of the present invention, there is provided an exposure method for exposing a substrate through a liquid on the substrate, the exposure method comprising: providing the liquid to a space between the substrate and a nozzle member having at least one of a supply port for supplying the liquid and a recovery port for recovering the liquid; adjusting at least one of a position and an inclination of the nozzle member depending on a position of a surface of an object arranged opposite to the nozzle member; and exposing the substrate through the liquid.

According to the exposure method of the present invention, at least one of the position and the inclination of the nozzle member is adjusted depending on the surface position of the object. Accordingly, the positional relationship between the nozzle member and the object can be maintained in a desired state. Therefore, for example, even when the surface position of the substrate or the substrate stage as the object is changed during the exposure, at least one of the position and the inclination of the nozzle member is adjusted depending on the change of the surface position. Accordingly, the liquid is satisfactorily retained between the nozzle member and the substrate. Therefore, it is possible to suppress the outflow of the liquid and the entrance and mixing of the bubble and/or the gas portion or the void into and with the liquid. It is thus possible to perform the exposure process accurately.

According to a fourth aspect of the present invention, there is provided a method for producing a device, comprising: exposing a substrate by the exposure method; developing the exposed substrate; and processing the developed substrate. According to this production method, the device can be produced in a state in which the high exposure accuracy is maintained. Therefore, it is possible to produce the device which exhibits the desired performance.

Effect of the Invention

According to the present invention, the exposure process can be performed accurately while retaining the liquid satisfactorily. It is possible to produce the device having the desired performance.

BRIEF DESCRIPTION OF THE DRAWINGS

FIG. 13 shows a magnified sectional view illustrating main components shown in FIG. 12.

BEST MODE FOR CARRYING OUT THE INVENTION

Embodiments of the present invention will be explained below with reference to the drawings. However, the present invention is not limited to the embodiments.

First Embodiment

Figure 1:
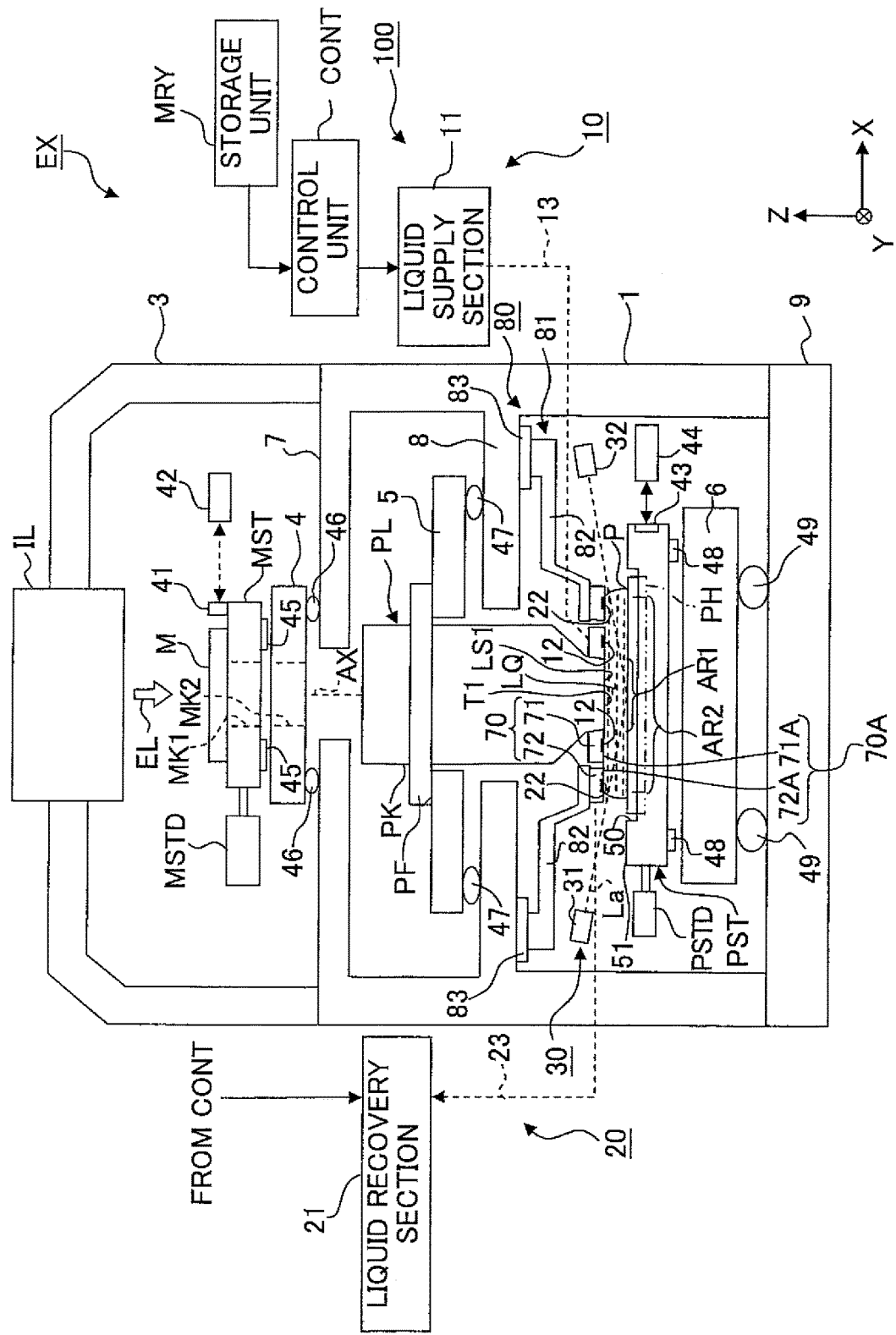
FIG. 1 shows a schematic arrangement view illustrating an exposure apparatus according to a first embodiment.

FIG. 1 is a schematic arrangement view illustrating an exposure apparatus EX according to a first embodiment. With reference to FIG. 1, the exposure apparatus EX includes a mask stage MST which is movable while holding a mask M, a substrate stage PST which is movable while holding a substrate P, an illumination optical system IL which illuminates, with an exposure light beam EL, the mask M held by the mask stage MST, a projection optical system PL which projects an image of a pattern of the mask M illuminated with the exposure light beam EL onto the substrate P held by the substrate stage PST to perform the exposure, and a control unit CONT which integrally controls the operation of the entire exposure apparatus EX. A storage unit MRY, which stores information in relation to the exposure process, is connected to the control unit CONT.

The exposure apparatus EX of this embodiment is a liquid immersion exposure apparatus to which the liquid immersion method is applied in order that the exposure wavelength is substantially shortened to improve the resolution and the depth of focus is substantially widened. The exposure apparatus EX is provided with a liquid immersion mechanism 100 which forms a liquid immersion area AR2 of the liquid LQ on the substrate P. The liquid immersion mechanism 100 includes an annular nozzle member 70 which is provided over or above the substrate P (substrate stage PST) and which is disposed to surround the projection optical system PL in the vicinity of the end portion of the projection optical system PL on a side of an image plane, a liquid supply mechanism 10 which supplies the liquid LQ onto the substrate P via supply ports 12 provided for the nozzle member 70, and a liquid recovery mechanism 20 which recovers the liquid LQ on the substrate P via a recovery port 22 provided for the nozzle member 70. In this embodiment, the nozzle member 70 is provided with a first nozzle member 71 which has the supply ports 12 for supplying the liquid LQ, and a second nozzle member 72 which has the recovery port 22 for recovering the liquid LQ. The first nozzle member 71 and the second nozzle member 72 are distinct (separate) members, and they are not mechanically connected to each other. The first nozzle member 71 is provided in an annular form to surround the vicinity of the end portion of the projection optical system PL on the side of the image plane, over or above the substrate P (substrate stage PST). The second nozzle member 72 is provided in an annular form to surround an outer side of the first nozzle member 71, over or above the substrate P (substrate stage PST).

The exposure apparatus EX forms the liquid immersion area AR2 locally on a part of the substrate P, including a projection area AR1 of the projection optical system PL by the liquid LQ supplied from the liquid supply mechanism 10 at least during the period in which the image of the pattern of the mask M is transferred onto the substrate P, the liquid immersion area AR2 being larger than the projection area AR1 and smaller than the substrate P. Specifically, the exposure apparatus EX adopts the local liquid immersion system wherein the space between an optical element LS1 which is arranged at the end portion of the projection optical system PL on the side of the image plane and a surface of the substrate P which is arranged on the side of the image plane, is filled with the liquid LQ. The exposure light beam EL, passes through the mask M, is radiated onto the substrate P through the liquid LQ between the projection optical system PL and the substrate P and via the projection optical system PL. Accordingly, the pattern of the mask M is projected onto the substrate P and exposes the pattern on the substrate P. The control unit CONT locally forms the liquid immersion area AR2 of the liquid LQ on the substrate P by supplying a predetermined amount of the liquid LQ onto the substrate P with the liquid supply mechanism 10, and by recovering a predetermined amount of the liquid LQ on the substrate P with the liquid recovery mechanism 20.

The exposure apparatus EX includes a nozzle-adjusting mechanism 80 which adjusts at least any one of the position and the posture (inclination) of the nozzle member 70 depending on a position of the surface (surface position) of the substrate P. The nozzle-adjusting mechanism 80 includes a driving mechanism 83 which is capable of driving the nozzle member 70 to adjust at least one of the relative distance and the relative inclination between the surface of the substrate P and at least a part of a lower surface 70A of the nozzle member 70. The lower surface 70A of the nozzle member 70 herein includes a lower surface 71A of the first nozzle member 71 and/or a lower surface 72A of the second nozzle member 72. The lower surface 70A of the nozzle member 70 is the surface which is opposed to (facing) the surface of the substrate P supported by the substrate stage PST. Therefore, the nozzle-adjusting mechanism 80 adjusts at least one of the relative distance and the relative inclination between the surface of the substrate P and at least one of the lower surfaces 71A, 72A. In the following description, the lower surfaces 71A, 72A of the first and second nozzle members 71, 72, which are opposed to the surface of the substrate P, are appropriately referred to as "lower surface 70A of the nozzle member 70" in combination.

The embodiment of the present invention will be explained as exemplified by a case in which the present invention is used in a scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. Of course, it is also allowable to use the present invention in a scanning type exposure apparatus in which the mask M and the substrate P are synchronously moved in a same scanning direction. In the following explanation, a Z axis direction is the direction which is coincident with an optical axis AX of the projection optical system PL, a X axis direction is a synchronous movement direction (scanning direction) for the mask M and the substrate P in a plane perpendicular to the Z axis direction, and a Y axis direction is a direction (non-scanning direction) which is perpendicular to the Z axis direction and the X axis direction. Directions of rotation (inclination) about the X axis, the Y axis, and the Z axis are designated as θX, θY, and θZ directions respectively.

The exposure apparatus EX includes a base 9 which is provided on the floor surface, and a main column 1 which is installed on the base 9. The main column 1 is formed with an upper stepped portion 7 and a lower stepped portion 8 which protrude inwardly. The illumination optical system IL is provided so that the mask M, which is supported on the mask stage MST, is illuminated with the exposure light beam EL. The illumination optical system IL is supported by a support frame 3 which is fixed to an upper portion of the main column 1.

The illumination optical system IL includes, for example, an exposure light source, an optical integrator which uniformizes the illuminance of light flux radiated from the exposure light source, a condenser lens which collects the exposure light beam EL emitted from the optical integrator, a relay lens system, and a field diaphragm which defines the illumination area on the mask M illuminated with the exposure light beam EL. A predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm), the $F_2$ laser beam (wavelength: 157 nm), and the like. In this embodiment, the ArF excimer laser beam is used.

In this embodiment, pure or purified water is used as the liquid LQ. Not only the ArF excimer laser beam but also the emission line (g-ray, h-ray, i-ray) radiated, for example, from a mercury lamp and the far ultraviolet light beam (DUV light beam) such as the KrF excimer laser beam (wavelength: 248 nm) are also transmissive through pure water.

The mask stage MST is movable while holding the mask M. The mask stage MST holds the mask M by the vacuum attraction (or the electrostatic attraction). A plurality of gas bearings (air bearings) 45, which are non-contact bearings, are provided on the lower surface of the mask stage MST. The mask stage MST is supported in a non-contact manner with respect to the upper surface (guide surface) of a mask surface plate 4 by the air bearings 45. Openings (side walls of the openings are indicated by MK1, MK2 respectively), through which the image of the pattern of the mask M is allowed to pass, are formed at central portions of the mask stage MST and the mask surface plate 4 respectively. The mask surface plate 4 is supported by the upper stepped portion 7 of the main column 1 via an anti-vibration unit 46. That is, in this construction, the mask stage MST is supported by the main column 1 (upper stepped portion 7) via the anti-vibration unit 46 and the mask surface plate 4. The mask surface plate 4 and the main column 1 are isolated from each other in terms of vibration by the anti-vibration unit 46 so that the vibration of the main column 1 is not transmitted to the mask surface plate 4 which supports the mask stage MST.

The mask stage MST is two-dimensionally movable in a plane perpendicular to the optical axis AX of the projection optical system PL, i.e., in the XY plane, and it is finely rotatable in the θZ direction on the mask surface plate 4 in a state in which the mask M is held thereon, in accordance with the driving operation of the mask stage-driving unit MSTD including, for example, a linear motor controlled by the control unit CONT, and the like. The mask stage MST is movable at a designated or predetermined scanning velocity in the X axis direction. The mask stage MST has a movement stroke in the X axis direction to such an extent that the entire surface of the mask M is capable of traversing (crossing) at least the optical axis AX of the projection optical system PL.

A movement mirror 41, which is movable together with the mask stage MST, is fixedly secured on the mask stage MST. A laser interferometer 42 is provided at a position opposed to (facing) the movement mirror 41. The position in the two-dimensional direction and the angle of rotation in the θZ direction (including angles of rotation in the θX and θY directions in some cases) of the mask M on the mask stage MST are measured in real-time by the laser interferometer 42. The result of the measurement of the laser interferometer 42 is outputted to the control unit CONT. The control unit CONT drives the mask stage-driving unit MSTD based on the result of the measurement performed by the laser interferometer 42 to thereby control the position of the mask M held by the mask stage MST.

The projection optical system PL projects the pattern of the mask M onto the substrate P at a predetermined projection magnification β to perform the exposure. The projection optical system PL includes a plurality of optical elements including the optical element LS1 provided at the end portion on the side of the substrate P. The optical elements are supported by a barrel PK. In this embodiment, the projection optical system PL is a reduction system having the projection magnification β which is, for example, ¼, ⅕, ⅛, or the like. The projection optical system PL may any one of the 1× magnification system and the magnifying system. The projection optical system PL may be any one of the dioptric system including no catoptric element, the catoptric system including no dioptric element, and the catadioptric system including dioptric and catoptric elements.

A flange PF is provided on the outer circumference of the barrel PK which holds the projection optical system PL. The projection optical system PL is supported by a barrel surface plate 5 via the flange PF. The barrel surface plate 5 is supported by the lower stepped portion 8 of the main column 1 via an anti-vibration unit 47. That is, in this construction, the projection optical system PL is supported by the main column 1 (lower stepped portion 8) via the anti-vibration unit 47 and the barrel surface plate 5. The barrel surface plate 5 is isolated from the main column 1 in terms of vibration by the anti-vibration unit 47 so that the vibration of the main column 1 is not transmitted to the barrel surface plate 5 which supports the projection optical system PL.

The substrate stage PST is movable while supporting the substrate holder PH which holds the substrate P. The substrate holder PH holds the substrate P, for example, by the vacuum attraction or the like. A recess 50 is provided on the substrate stage PST. The substrate holder PH for holding the substrate P is arranged in the recess 50. The upper surface 51, other than the recess 50, of the substrate stage PST forms a flat surface (flat portion) which has approximately the same height as that of (is flush with) the surface of the substrate P held by the substrate holder PH.

A plurality of gas bearings (air bearings) 48, which are non-contact bearings, are provided on the lower surface of the substrate stage PST. The substrate stage PST is supported in a non-contact manner by the air bearings 48 with respect to the upper surface (guide surface) of a substrate surface plate 6. The substrate surface plate 6 is supported on the base 9 via an anti-vibration unit 49. The substrate surface plate 6 is isolated from the main column 1 and the base 9 (floor surface) in terms of vibration by the anti-vibration unit 49 so that the vibrations of the base 9 (floor surface) and the main column 1 are not transmitted to the substrate surface plate 6 which supports the substrate stage PST.

The substrate stage PST is two-dimensionally movable in the XY plane, and it is finely rotatable in the θZ direction on the substrate surface plate 6 in a state in which the substrate P is held via the substrate holder PH, in accordance with the driving operation of the substrate stage-driving unit PSTD including, for example, a linear motor which is controlled by the control unit CONT or the like. Further, the substrate stage PST is also movable in the Z axis direction, the θX direction, and the θY direction. Therefore, the surface of the substrate P supported by the substrate stage PST is movable in the directions of six degrees of freedom in the X axis, Y axis, Z axis, θX, θY, and θZ directions.

A movement mirror 43, which is movable together with the substrate stage PST, is fixedly secured to a side surface of the substrate stage PST. A laser interferometer 44 is provided at a position opposed to (facing) the movement mirror 43. The position in the two-dimensional direction and the angle of rotation of the substrate P on the substrate stage PST are measured in real time by the laser interferometer 44.

The exposure apparatus EX is provided with a focus/leveling-detecting system 30 based on the oblique incidence system which detects the surface position information about the surface of the substrate P supported by the substrate stage PST, as disclosed, for example, in Japanese Patent Application Laid-open No. 8-37149. The focus/leveling-detecting system 30 includes a light-emitting system 31 which radiates a detecting light beam La, through the liquid LQ, onto the surface of the substrate P; and a light-receiving system 32 which receives a reflected light beam of the detecting light beam La radiated onto the surface of the substrate P. The focus/leveling-detecting system 30 detects a surface position information about the surface of the substrate P (position information in the Z axis direction, and information about the inclination in the θX and θY directions of the substrate P). A system, in which the detecting light beam La is radiated onto the surface of the substrate P not through the liquid LQ, may be adopted for the focus/leveling-detecting system. Alternatively, a system, which uses an electrostatic capacity type sensor, may be adopted as the focus/leveling-detecting system.

The result of the measurement performed by the laser interferometer 44 is outputted to the control unit CONT. The result of the detection performed by the focus/leveling-detecting system 30 is also outputted to the control unit CONT. The control unit CONT drives the substrate stage-driving unit PSTD based on the detection result of the focus/leveling-detecting system 30 to adjust and match the surface of the substrate P with respect to the image plane of the projection optical system PL in the auto-focus manner and the auto-leveling manner by controlling the focus position (Z position) and the angle of inclination (θX, θY) of the substrate P. Further, the control unit CONT controls the position of the substrate P in the X axis direction, the Y axis direction, and the θZ direction based on the measurement result of the laser interferometer 44.

The liquid supply mechanism 10 of the liquid immersion mechanism 100 supplies the liquid LQ to the side of the image plane of the projection optical system PL. The liquid supply mechanism 10 includes a liquid supply section 11 which is capable of feeding the liquid LQ, and a supply tube 13 which has one end connected to the liquid supply section 11. The other end of the supply tube 13 is connected to the first nozzle member 71. The liquid supply section 11 includes, for example, a tank for accommodating the liquid LQ, a pressurizing pump, a temperature-adjusting unit for adjusting the temperature of the liquid LQ to be supplied, and a filter unit for removing any foreign matter (including any bubble) from the liquid LQ, and the like. The operation of the liquid supply section 11 is controlled by the control unit CONT.

It is not necessarily indispensable that the liquid supply mechanism 10 of the exposure apparatus EX is provided with all of the tank, the pressurizing pump, the temperature-adjusting unit, the filter unit and the like. At least a part or parts of these components may be replaced with the equipment of a factory or the like in which the exposure apparatus EX is installed.

The liquid recovery mechanism 20 of the liquid immersion mechanism 100 recovers the liquid LQ on the side of the image plane of the projection optical system PL. The liquid recovery mechanism 20 includes a liquid recovery section 21 which is capable of recovering the liquid LQ, and a recovery tube 23 which has one end connected to the liquid recovery section 21. The other end of the recovery tube 23 is connected to the second nozzle member 72. The liquid recovery section 21 includes, for example, a vacuum system (suction unit) such as a vacuum pump, a gas/liquid separator for separating the gas and the recovered liquid LQ from each other, and a tank for accommodating the recovered liquid LQ. The operation of the liquid recovery section 21 is controlled by the control unit CONT.

It is not necessarily indispensable that the liquid recovery mechanism 20 of the exposure apparatus EX is provided with all of the vacuum system, the gas/liquid separator, the tank and the like. At least a part or parts of these components may be replaced with the equipment of a factory or the like in which the exposure apparatus EX is installed.

Figure 2:
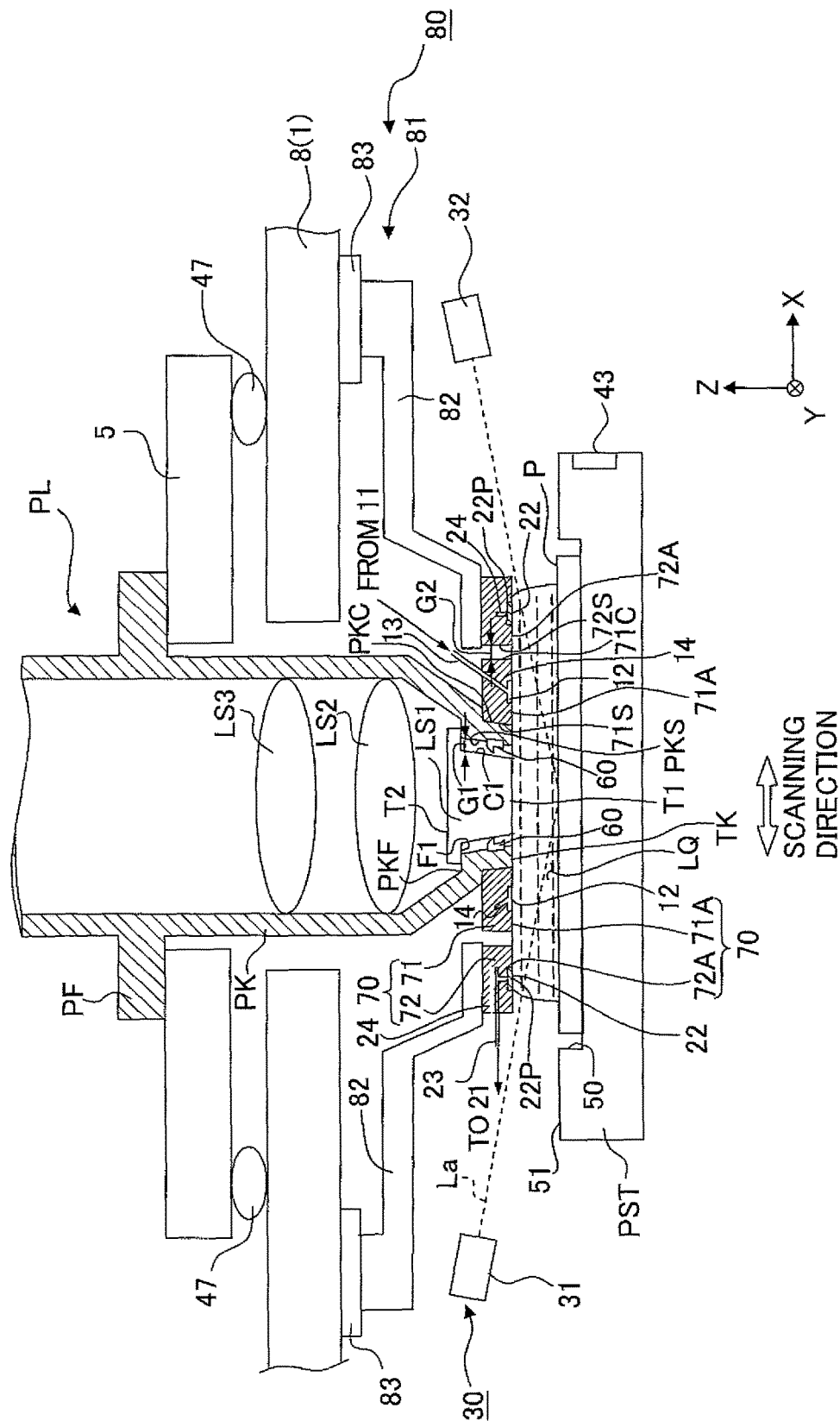
FIG. 2 shows a magnified sectional view illustrating main components shown in FIG. 1.

FIG. 2 shows a side sectional view illustrating those disposed in the vicinity of the end portion of the projection optical system PL on the side of the image plane. In FIG. 2, three optical elements LS1 to LS3 are shown as the optical elements constructing the projection optical system PL. However, actually, the projection optical system PL is constructed by a plurality of, i.e., three or more optical elements. The optical element LS1, which is provided at the end portion of the projection optical system PL on the side of the image plane and which is included in the plurality of optical elements constructing the projection optical system PL, is an optical element having no refractive power with no lens function, and is a plane-parallel. That is, the lower surface T1 and the upper surface T2 of the optical element LS1 are substantially flat surfaces respectively, and are substantially parallel to each other. As for the optical element LS1, it is also allowable to use an optical element which has any refractive power and which has its upper surface T2 formed to expand toward a plane of the object (object plane) of the projection optical system PL (toward the mask M).

The outer diameter of the upper surface T2 of the optical element LS1 is formed to be larger than the outer diameter of the lower surface T1. A flange portion F1 is formed in the vicinity of the upper surface T2 of the optical element LS1. The barrel PK is provided to surround the outer side surface C1 of the optical element LS1. A support portion PKF, which supports the flange portion F1 of the optical element LS1, is provided inside the barrel PK. The lower surface TK of the barrel PK is substantially flush with the lower surface T1 of the optical element LS1 supported (held) by the barrel PK.

A predetermined gap G1 is provided between an inner side surface PKS of the barrel PK and an outer side surface C1 of the optical element LS1. A seal member 60 is provided in the gap G1. The seal member 60 suppresses the inflow of the liquid LQ of the liquid immersion area AR2 into the gap G1, and the seal member 60 prevents the gas existing in the gap G1 from entering into and mixing with the liquid LQ of the liquid immersion area AR2. If the liquid LQ makes inflow into the gap G1, then there is such a possibility that any force may be exerted on the outer side surface C1 of the optical element LS1, and there is such a possibility that the optical element LS1 is vibrated and/or deformed by the force. Further, there is such a possibility that the gas existing in the gap G1 inflows into and mixes with the liquid LQ of the liquid immersion area AR2, and that the mixed gas (bubble) inflows into the optical path for the exposure light beam EL. In order to lower the possibilities as described above, the seal member 60 is provided in the gap G1 between the inner side surface PKS of the barrel PK and the outer side surface C1 of the optical element LS1.

In this embodiment, the seal member 60 is a V-ring having a V-shaped cross section. A body portion of the V-ring is held by the inner side surface PKS of the barrel PK. An end portion of the V-ring, which has a flexibility, makes contact with the outer side surface C1 of the optical element LS1. Any one of various seal members including, for example, O-rings, C-rings, and the like is usable as the seal member 60 provided that it is possible to suppress the inflow of the liquid LQ of the liquid immersion area AR2 into the gap G1 and the entrance and mixing of the gas existing in the gap G into the liquid immersion area AR2, and that the stress exerted on the optical element LS1 is small.

The nozzle member 70 is formed to have an annular shape to surround the projection optical system PL in the vicinity of the end portion of the projection optical system PL on the side of the image plane. The nozzle member 70 includes the first nozzle member 71 which is arranged to surround the optical element LS1 of the projection optical system PL, and the second nozzle member 72 which is arranged to surround the outer side of the first nozzle member 71. The first nozzle member 71 is supported by the barrel PK which holds the optical elements constructing the projection optical system PL. The first nozzle member 71 is an annular member connected to the outer side surface PKC of the barrel PK. There is no gap between the outer side surface PKC of the barrel PK and an inner side surface 71S of the first nozzle member 71. That is, the barrel PK and the first nozzle member 71 are joined to each other without any gap, and are constructed substantially as an integrated body. Therefore, the liquid LQ of the liquid immersion area AR2 makes no inflow into any space between the outer side surface PKC of the barrel PK and the inner side surface 71S of the first nozzle member 71. It is also possible to prevent the gas from entering into and mixing with the liquid LQ of the liquid immersion area AR2, which would be otherwise caused by the presence of any gap between the outer side surface PKC of the barrel PK and the inner side surface 71S of the first nozzle member 71.

The second nozzle member 72 is supported by the lower stepped portion 8 of the main column 1 via a support mechanism 81. The support mechanism 81 is provided with a connecting member 82, and a driving mechanism 83 which is provided between one end (upper end) of the connecting member 82 and the lower stepped portion 8. The other end (lower end) of the connecting member 82 is connected (fixed) to the upper surface of the second nozzle member 72. The support mechanism 81 is capable of moving the second nozzle member 72 with respect to the lower stepped portion S of the main column 1 by driving the driving mechanism 83. Although not shown in the drawing, the support mechanism 81 is also provided with a passive anti-vibration mechanism which performs passive vibration-prevention so that the vibration generated in the second nozzle member 72 is not transmitted to the lower stepped portion 8 of the main column 1. The passive anti-vibration mechanism is provided between the connecting member 82 and the lower stepped portion 8 of the main column 1, and is constructed of, for example, an air spring (for example, an air cylinder, an air bellows, or the like). The passive anti-vibration mechanism prevents the vibration of the second nozzle member 72 from being transmitted to the main column 1 by the elastic function of the gas (air). The passive anti-vibration mechanism may include a coil spring. The second nozzle member 72 is also an annular member similarly to the first nozzle member 71. The second nozzle member 72 is provided to surround the outer side surface 71C of the first nozzle member 71. A predetermined gap G2 is provided between an outer side surface 71C of the first nozzle member 71 connected to the barrel PK and an inner side surface 72S of the second nozzle member 72 supported by the support mechanism 81. Therefore, the first nozzle member 71 and the second nozzle member 72 are not directly connected to each other, and are isolated from each other in terms of vibration.

The first and second nozzle members 71, 72 have the lower surfaces 71A, 72A which are opposite to (facing) the surface of the substrate P (upper surface of the substrate stage PST) respectively. The lower surface 71A of the first nozzle member 71 connected to the barrel PK is substantially flush with the lower surface 72A of the second nozzle member 72 supported by the support mechanism 81. The lower surfaces 71A, 72A of the first and second nozzle members 71, 72 are substantially flush with the lower surface T1 of the optical element LS1. Therefore, in this embodiment, the lower surface 71A of the first nozzle member 71, the lower surface 72A of the second nozzle member 72, the lower surface TK of the barrel PK, and the lower surface T1 of the optical element LS1 are substantially flush with one another.

The supply ports 12 which supplies the liquid LQ onto the substrate P are provided on the lower surface 71A of the first nozzle member 71. The recovery port 22 which recovers the liquid LQ on the substrate P is provided on the lower surface 72A of the second nozzle member 72. The supply port 12 is provided as a plurality of supply ports 12 on the lower surface 71A of the first nozzle member 71 to surround the optical axis AX of the projection optical system PL (see FIG. 3). The recovery port 22 is provided on the lower surface 72A of the second nozzle member 72 such that the recovery port 22 is further away outwardly, from the optical axis AX of the projection optical system PL, than the supply ports 12 provided on the lower surface 71A of the first nozzle member 71. The recovery port 22 is formed to have, for example, an annular slit-shaped form on the lower surface 72A of the second nozzle member 72 to surround the optical axis AX of the projection optical system PL (see FIG. 3). In this embodiment, a porous member (mesh member) 22P is arranged in the recovery port 22.

An internal flow passage 14, which connects each of the plurality of supply ports 12 with the supply tube 13, is provided in the first nozzle member 71. The internal flow passage 14, which is formed in the first nozzle member 71, is branched at intermediate positions thereof so that the internal flow passage 14 can be connected to each of the supply ports 12. An internal flow passage 24, which connects the annular recovery port 22 and the recovery tube 23, is provided in the second nozzle member 72 (see FIG. 2). The internal flow passage 24 is formed to have an annular form to be adapted to the annular recovery port 22. The internal flow passage 24 includes an annular flow passage which is connected to the recovery port 22, and a manifold flow passage which connects a part of the annular flow passage and the recovery tube 23. When the liquid LQ is to be supplied onto the substrate P, the control unit CONT feeds the liquid LQ from the liquid supply section 11 to supply the liquid LQ onto the substrate P, from the supply ports 12 provided at positions over or above the substrate P, via the supply tube 13 and the internal flow passage 14 of the first nozzle member 71. When the liquid LQ on the substrate P is to be recovered, the control unit CONT drives the liquid recovery section 12. When the liquid recovery section 21 is driven, then the liquid LQ on the substrate P is allowed to flow into the internal flow passage 24 of the second nozzle member 72 via the recovery port 22 provided at positions over or above the substrate P, and the liquid LQ is recovered by the liquid recovery section 21 via the recovery tube 23.

When the liquid immersion area AR2 of the liquid LQ is to be formed, the control unit CONT uses the liquid supply mechanism 10 and the liquid recovery mechanism 20 of the liquid immersion mechanism 100 to supply and recover the liquid LQ with respect to the substrate P. The liquid LQ forms the liquid immersion area AR2 with which the space between the surface of the substrate P and the lower surface 70A (71A, 72A) of the nozzle member 70 and the lower surface T1 of the optical element LS1 of the projection optical system PL is filled.

Figure 3:
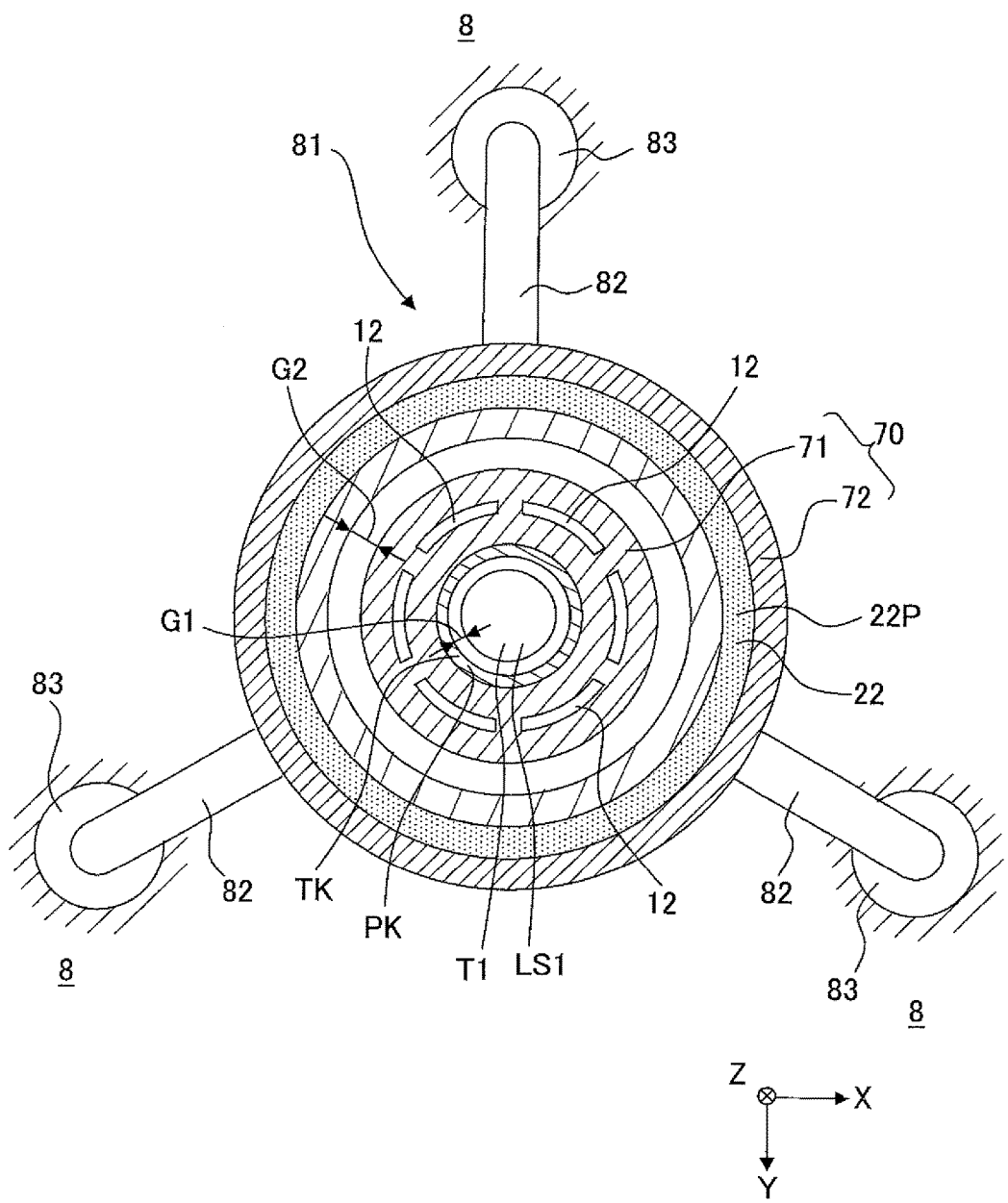
FIG. 3 shows a view illustrating a nozzle member as viewed from the lower side.

FIG. 3 shows the nozzle member 70 as viewed from below. As shown in FIG. 3, the support mechanism 81 supporting the second nozzle member 72 includes three connecting members 82, and three driving mechanisms 83 which are provided corresponding to the connecting members 82 respectively. The respective connecting members 82 are arranged at approximately equal intervals (120° intervals) in the circumferential direction (θZ direction) of the second nozzle member 72. Lower ends of the connecting members 82 are fixed in the upper surface of the second nozzle member 72 at three predetermined positions, respectively. Each of the driving mechanisms 83 is provided between the upper end of one of the three connecting members 82 and the lower stepped portion 8 of the main column 1. That is, in this embodiment, the driving mechanisms 83 are also arranged at approximately equal intervals (120° intervals). The passive anti-vibration mechanism is also provided as three passive anti-vibration mechanisms corresponding to the connecting members 82 respectively. The driving mechanism 83 is constructed of, for example, a linear motor, a voice coil motor or the like driven, for example, by the Lorentz's force. The voice coil motor or the like, which is driven by the Lorentz's force, has a coil unit and a magnet unit. The coil unit and the magnet unit are driven in a non-contact state. Therefore, when the driving mechanism 83 is constructed of a driving mechanism such as the voice coil motor or the like driven by the Lorentz's force, then it is possible to suppress the generation of the vibration.

The operation of the driving mechanism 83 is controlled by the control unit CONT. The control unit CONT uses the three driving mechanisms 83 so that the second nozzle member 72, which is connected to the connecting members 82, is driven (displaced or moved) with respect to the lower stepped portion 8 of the main column 1. That is, the control unit CONT adjusts a driving amount by which each of the plurality of driving mechanisms 83 is moved, to thereby adjust at least any one of the position and the posture (inclination) of the second nozzle member 72 connected to the connecting members 82. In this embodiment, three pieces of the driving mechanisms 83 are provided. The control unit CONT adjusts the respective driving amounts of the plurality of driving mechanisms 83, thereby making it possible to drive the second nozzle member 72 in relation to the directions of three degrees of freedom of the θX direction, the θY direction, and the Z axis direction.

The control unit CONT adjusts at least one of the position and the posture of the second nozzle member 72 based on the detection result of the focus/leveling-detecting system 30 which detects the surface position information of the surface of the substrate P.

In this embodiment, the nozzle-adjusting mechanism 80 has the three driving mechanisms 83. However, the number and the position(s) of the driving mechanism or mechanisms 83 can be arbitrarily set. For example, six pieces of the driving mechanisms 83 may be provided, and the second nozzle member 72 may be driven (displaced or moved) in relation to the directions of six degrees of freedom (directions of X axis, Y axis, Z axis, θX, θY, and θZ). As described above, the number and the position(s) of the driving mechanism or mechanisms 83 may be appropriately set depending on the number of degrees of freedom in which the second nozzle member 72 is intended to be driven.

Next, an explanation will be made about a method which exposes the substrate P by projecting an image of a pattern of the mask M onto the substrate P by using the exposure apparatus EX constructed as described above.

After the substrate P is loaded on a substrate holder PH, the control unit CONT supplies and recovers the liquid LQ with respect to the surface of the substrate P by using the liquid supply mechanism 10 and the liquid recovery mechanism 20 of the liquid immersion mechanism 100. A space between the surface of the substrate P and the lower surface 70A of the nozzle member 70 and the lower surface T1 of the projection optical system PL is filled with the liquid LQ in accordance with the liquid supply operation and the liquid recovery operation performed by the liquid immersion mechanism 100. The liquid immersion area AR2 of the liquid LQ is locally formed on the substrate P.

The exposure apparatus EX of the embodiment of the present invention projects the image of the pattern of the mask M onto the substrate P while moving the mask M and the substrate P in the X axis direction (scanning direction). The substrate P is subjected to the scanning exposure while being moved in the X axis direction. During the scanning exposure, a part of the image of the pattern of the mask M is projected onto a portion included in the projection area AR1 via the projection optical system PL and the liquid LQ of the liquid immersion area AR2; and the mask M is moved at the velocity V in the −X direction (or in the +X direction), in synchronization with which the substrate P is moved at the velocity β·V (β represents the projection magnification) in the +X direction (or in the −X direction) with respect to the projection area AR1. A plurality of shot areas are defined on the substrate P. After the exposure is completed for one shot area, the next shot area is moved to a scanning start position in accordance with the stepping movement of the substrate P. The scanning exposure process is successively performed thereafter for the respective shot areas while moving the substrate P in the step-and-scan manner.

During the scanning exposure for each of the shot areas, the surface position information of the substrate P (position information and inclination information in the Z direction) is detected by the focus/leveling-detecting system 30. The control unit CONT adjusts the positional relationship between the surface of the substrate P and the image plane of the projection optical system PL based on the detection result of the focus/leveling-detecting system 30, during the scanning exposure for the substrate P. Specifically, the control unit CONT drives the substrate stage PST via the substrate stage-driving mechanism PSTD so that the surface of the substrate P is matched with the image plane formed through the liquid LQ and the projection optical system PL to adjust the surface position (Z position, θX, θY) of the substrate P supported by the substrate stage PST. The adjusting mechanism for adjusting the positional relationship between the substrate P and the image plane of the projection optical system PL is not limited to only the substrate stage PST (substrate stage-driving mechanism PSTD) adjusting the surface position of the surface of the substrate P. For example, it is also allowable to adopt an imaging characteristic-adjusting unit provided for a projection optical system PL as disclosed in Japanese Patent Application Laid-open No. 60-78454. The imaging characteristic-adjusting unit is capable of adjusting the position of image plane of the projection optical system PL by driving a specified optical element among a plurality of optical elements constructing the projection optical system PL and/or by adjusting the pressure in the barrel PK. Therefore, the control unit CONT can adjust the positional relationship between the surface of the substrate P and the image plane of the projection optical system PL to match the image plane of the projection optical system PL and the surface of the substrate P by driving the imaging characteristic-adjusting unit based on the detection result of the focus/leveling-detecting system 30. The surface of the substrate P and the image plane of the projection optical system PL may be matched with each other by using, in combination, the driving operation of the substrate stage PST and the driving operation of the imaging characteristic-adjusting unit.

The control unit CONT adjusts at least one of the position and the posture (Z position, θX, θY) of the second nozzle member 72 depending on the surface position of the substrate P (Z position, θX, θY). Specifically, the control unit CONT adjusts at least one of the position and the posture of the second nozzle member 72 based on the surface position information of the surface of the substrate P, i.e., the detection result of the focus/leveling-detecting system 30 to perform the adjustment so that at least one of the relative distance and the relative inclination between the surface of the substrate P and the annular lower surface 72A of the second nozzle member 72 is maintained in a desired state.

When the relative distance or the relative inclination between the surface of the substrate P and the lower surface 72A of the second nozzle member 72 is varied, then the liquid LQ cannot be retained satisfactorily, and there is such a possibility that the liquid LQ of the liquid immersion area AR2 may outflow and/or any bubble may enter into and mix with the liquid immersion area AR2. The control unit CONT drives the driving mechanisms 83 to adjust at least one of the position and the posture of the second nozzle member 72 so that the relative distance and the relative inclination between the surface of the substrate P and the lower surface 72A of the second nozzle member 72 is maintained to be substantially constant during the scanning exposure for the substrate P. Accordingly, the liquid LQ can be satisfactorily retained between the substrate P and the lower surface 72A of the second nozzle member 72, thereby making it possible to prevent the liquid LQ of the liquid immersion area AR2 from outflowing and the bubble from entering into and mixing with the liquid immersion area AR2.

Figure 4:
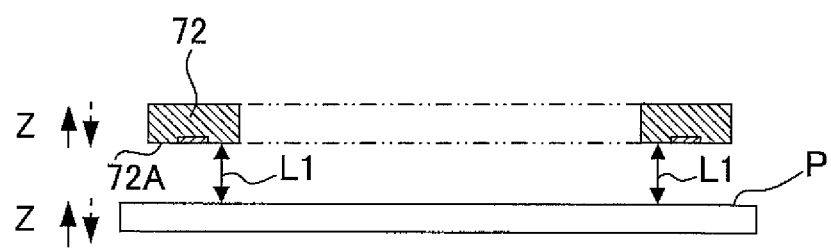
FIGS. 4(A) to 4(C) schematically illustrate the operation of the nozzle member.
Figure 4:
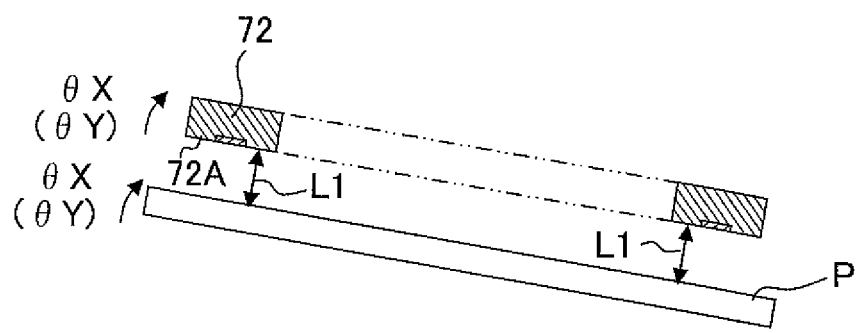
Figure 4:
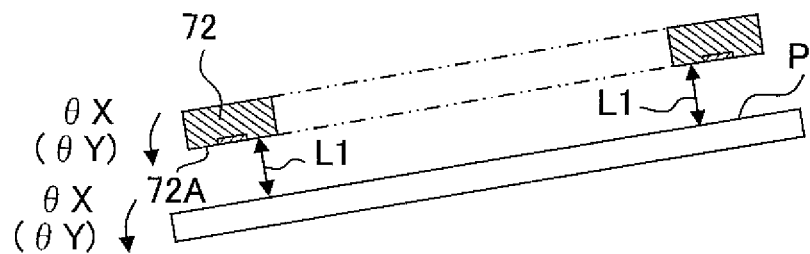

In this embodiment, the control unit CONT adjusts at least one of the position and the posture of the second nozzle member 72 so that a distance between the surface of the substrate P and the lower surface 72A of the second nozzle member 72 is L1 (approximately 1 mm), and that the surface of the substrate P and the lower surface 72A are substantially parallel to each other. That is, as schematically shown in FIG. 4(A), in order to match the image plane of the projection optical system PL with the surface of the substrate P during the scanning exposure for the substrate P, when the position of the surface of the substrate P in the Z axis direction is varied, the control unit CONT changes the position of the second nozzle member 72 in the Z axis direction by the driving mechanisms 83 so that the relative distance between the surface of the substrate P and the lower surface 72A of the second nozzle member 72 is maintained to be the predetermined distance L1. On the other hand, when the surface of the substrate P is inclined in the θX direction or in the θY direction, as shown in FIGS. 4(B) and 4(C), then the control unit CONT changes the position of the second nozzle member 72 in the θX direction or the θY direction (inclination of the second nozzle member 72) by the driving mechanisms 83 while maintaining the relative distance between the surface of the substrate P and the lower surface 72A of the second nozzle member 72 to be the predetermined distance L1, and maintaining the relative inclination between the surface of the substrate P and the lower surface 72A of the second nozzle member 72 to be substantially parallel. That is, the control unit CONT drives the driving mechanisms 83 depending on the change of the surface position of the substrate P to move the lower surface 72A of the second nozzle member 72 in the normal line direction and the direction of inclination of the surface of the substrate P. The initial position and the initial inclination of the second nozzle member 72 are previously set to have predetermined values respectively in relation to a reference surface position (designed value) of the substrate P. The driving mechanisms 83 displaces or moves the second nozzle member 72 based on the preset initial values so that the relative distance between the surface of the substrate P and the lower surface 72A of the second nozzle member 72 is maintained to be the predetermined distance L1, and that the parallelism between the surface of the substrate P and the lower surface 72A of the second nozzle member 72 is maintained.

As described above, the control unit CONT adjusts at least one of the position and the posture of the second nozzle member 72 to follow the change in the surface position of the substrate P during the scanning exposure for the substrate P. Accordingly, the relative distance and the relative inclination between the surface of the substrate P and the lower surface 72A of the second nozzle member 72 can be maintained to be constant.

In this embodiment, the lower surface 70A (71A, 72A) of the nozzle member 70, the lower surface TK of the barrel PK, and the lower surface T1 of the projection optical system PL (optical element LS1) are substantially flush with one another. Therefore, the liquid immersion area AR2 is formed satisfactorily between the substrate P and the lower surface 70A of the nozzle member 70 and the lower surface T1 of the projection optical system PL. However, it is not necessarily indispensable that the lower surface 71A, the lower surface 72A, the lower surface TK, and the lower surface T1 are flush with one another. The positions of the respective lower surfaces in the Z direction can be set such that the liquid immersion area AR2 can be maintained satisfactorily. When the lower surface 70A of the nozzle member 70, the lower surface T1 of the projection optical system PL, and the lower surface TK of the barrel PK, which are liquid contact surfaces which make contact with the liquid LQ of the liquid immersion area AR2, are made liquid-attractive with respect to the liquid LQ, then the liquid immersion area AR2 can be maintained in the desired state more satisfactorily. The upper surface 51, which is substantially flush with the surface of the substrate P, is provided around the substrate P in a state that any difference in height is hardly brought about outside the edge portion of the substrate P. Therefore, for example, when the edge area of the surface of the substrate P is subjected to the liquid immersion exposure, the liquid immersion area AR2 can be formed satisfactorily by retaining the liquid LQ on the side of the image plane of the projection optical system PL. The gap of about 0.1 to 1 mm is provided between the edge portion of the substrate P and the flat surface (upper surface) 51 provided around the substrate P. However, the liquid LQ scarcely inflows into the gap owing to the surface tension of the liquid LQ. When the upper surface 51 is liquid-repellent with respect to the liquid LQ, it is possible to suppress the outflow of the liquid LQ to the outside of the substrate stage PST, even when a part of the liquid immersion area AR2 is arranged on the upper surface 51 (i.e., when the liquid LQ forming the liquid immersion area AR2 is retained in a space between the substrate P and the upper surface 51 of the substrate stage PST, and the lower surfaces 70A, T1 of the nozzle member and projection optical system PL). In this case also, it is possible to prevent the liquid LQ from remaining on the upper surface 51.

In this embodiment, the liquid recovery mechanism 20 recovers the liquid LQ via the recovery port 22 by driving the vacuum system provided for the liquid recovery section 21. In this case, there is such a possibility that the liquid LQ is recovered via the recovery port 22 together with surrounding gas. Therefore, the vibration tends to be generated in the second nozzle member 72 having the recovery port 22 than in the first nozzle member 71. However, the gap G2 is provided between the first nozzle member 71 and the second nozzle member 72 (they are not mechanically connected to each other). Therefore, the vibration generated in the second nozzle member 72 is not directly transmitted to the first nozzle member 71 and the barrel PK (projection optical system PL) connected to the first nozzle member 71.

Further, the second nozzle member 72 is supported by the main column 1 (lower stepped portion 8) by the support mechanism 81 including the passive anti-vibration mechanisms. Therefore, the vibration generated in the second nozzle member 72 is also suppressed from being transmitted to the main column 1.

The main column 1, which supports the second nozzle member 72 via the support mechanism 81, is isolated in terms of vibration by the anti-vibration unit 47 from the barrel surface plate 5 which supports the barrel PK of the projection optical system PL via the flange PF. Therefore, the vibration generated in the second nozzle member 72 is prevented from being transmitted to the projection optical system PL owing to the respective functions of the anti-vibration unit 47 and the passive anti-vibration mechanisms of the support mechanism 81. The main column 1 is isolated in terms of vibration by the anti-vibration unit 49 from the substrate surface plate 6 which supports the substrate stage PST. Therefore, the vibration generated in the second nozzle member 72 is also prevented from being transmitted to the substrate stage PST via the main column 1 and the base 9. The main column 1 is isolated in terms of vibration by the anti-vibration unit 46 from the mask surface plate 4 which supports the mask stage MST. Therefore, the vibration generated in the second nozzle member 72 is also prevented from being transmitted to the mask stage MST via the main column 1.

On the other hand, the first nozzle member 71 has no recovery port. The first nozzle member 71 has only the supply ports 12 for supplying the liquid LQ. When the liquid LQ is supplied via the supply ports 12, there is hardly a possibility that any vibration is generated to such an extent that the exposure accuracy is affected thereby. Therefore, even when the first nozzle member 71 is connected to the barrel PK of the projection optical system PL, it is unlikely that any vibration is generated in the projection optical system PL (barrel PK) resulting from the first nozzle member 71 to such an extent that the exposure accuracy is affected thereby. The exposure accuracy is therefore maintained.

The gap G2 has a distance to such an extent that the second nozzle member 72 does not abut against (interfere with) the first nozzle member 71 even when the second nozzle member 72 is driven by the driving mechanisms 83. Therefore, the driving operation of the second nozzle member 72 by the driving mechanisms 83 is not inhibited. In order not to inhibit the driving operation of the second nozzle member 72, it is preferable that at least a part of the recovery tube 23 connected to the second nozzle member 72 is constructed of, for example, a flexible tube which is expandable and contractible.

Figure 5:
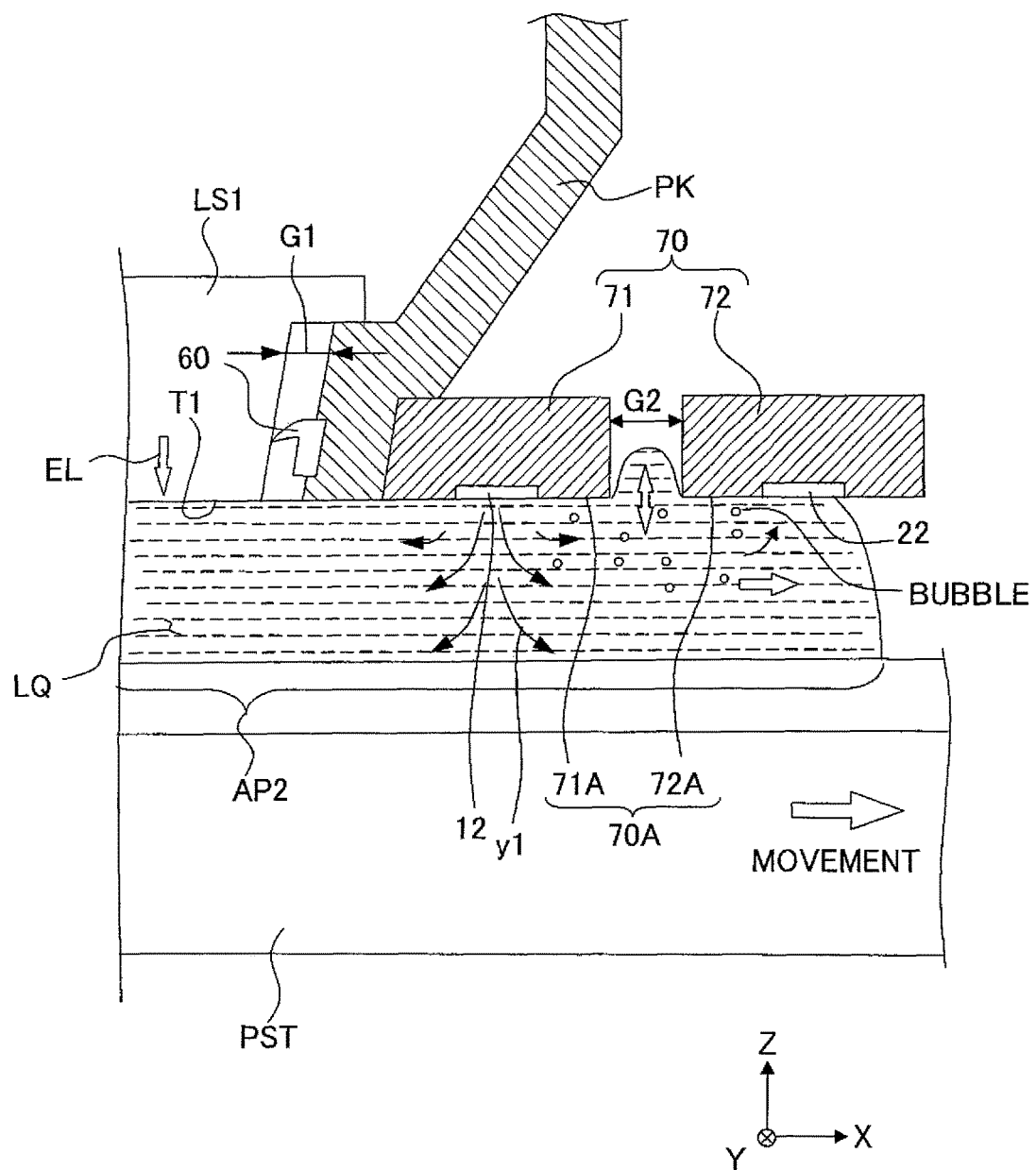
FIG. 5 schematically illustrates the behavior of the liquid of the liquid immersion area.

As the substrate P is moved to perform the scanning exposure, there is such a possibility that the liquid LQ of the liquid immersion area AR2 between the substrate P and the lower surface T1 of the projection optical system PL and the lower surface 70A of the nozzle member 70, is moved as if the liquid LQ is pulled by the moving substrate P. For example, as shown in FIG. 5, there is such a possibility that a part of the liquid LQ of the liquid immersion area AR2 is moved in the +X direction in accordance with the movement of the substrate P in the +X direction. However, the gap G2 is formed between the first nozzle member 71 and the second nozzle member 72, and the upper end of the gap G2 is open to the atmospheric air. Therefore, the liquid LQ can enter and exit the gap G2. Therefore, even when the size (diameter) of the nozzle member 70 is small, it is possible to suppress the outflow of the liquid LQ to the outside of the recovery port 22.

A possibility is assumed such that the gas existing in the gap G2 enters into and mixes with the liquid LQ of the liquid immersion area AR2. However, the gap G2 is provided outside the supply ports 12 with respect to the optical path for the exposure light beam EL (projection area AR1). A part of the liquid LQ supplied from the supply ports 12 forms a flow of the liquid directed to the outside of the supply ports 12 (see arrows y1 shown in FIG. 5). Therefore, even when any bubble enters from the gap G2 into and mixes with the liquid LQ of the liquid immersion area AR2, the mixed bubble is moved by the flow of the part of the liquid LQ supplied from the supply ports 12 so that the bubble moves away from the optical path for the exposure light beam EL. Therefore, it is possible to avoid the occurrence of the deterioration of the accuracy in the transfer of the pattern of the mask M onto the substrate P, which would be otherwise caused by the inflow of the mixed gas (bubble) into the optical path for the exposure light beam EL.

As explained above, when the liquid immersion area AR2 is formed by retaining the liquid LQ between the lower surface 70A of the nozzle member 70 and the surface of the substrate P, at least one of the position and the posture of the nozzle member 70 is adjusted depending on the surface position of the substrate P. Accordingly, the positional relationship between the nozzle member 70 and the substrate P can be maintained in the desired state. Therefore, even when the surface position of the substrate P is changed during the scanning exposure, the liquid LQ is satisfactorily retained between the nozzle member 70 and the substrate P, and the liquid LQ is consequently retained between the projection optical system PL and the substrate P satisfactorily as well. Therefore, it is possible to suppress the outflow of the liquid LQ to the outside of the substrate P and to prevent the bubble from entering into and mixing with the liquid LQ. The exposure apparatus EX can thus perform the exposure process accurately.

In particular, in this embodiment, among first and second nozzle members 71, 72, at least one of the position and the posture of the second nozzle member 72 having the recovery port 22 is adjusted. Therefore, the liquid LQ can be recovered satisfactorily via the recovery port 22 of the second nozzle member 72 while following the change of the surface position of the substrate P. Therefore, the liquid recovery mechanism 20 can satisfactorily recover the liquid LQ even during the scanning exposure for the substrate P. The first nozzle member 71 may be supported by the lower stepped portion of the main column 1 via a support mechanism having a driving mechanism in the same manner as the second nozzle member 72, instead of connecting the first nozzle member 71 to the barrel PK, so that at least one of the position and the posture (position and inclination in the Z direction) of the first nozzle member 71 is adjusted depending on the surface position of the substrate P independently from the second nozzle member 72.

Second Embodiment

Figure 6:
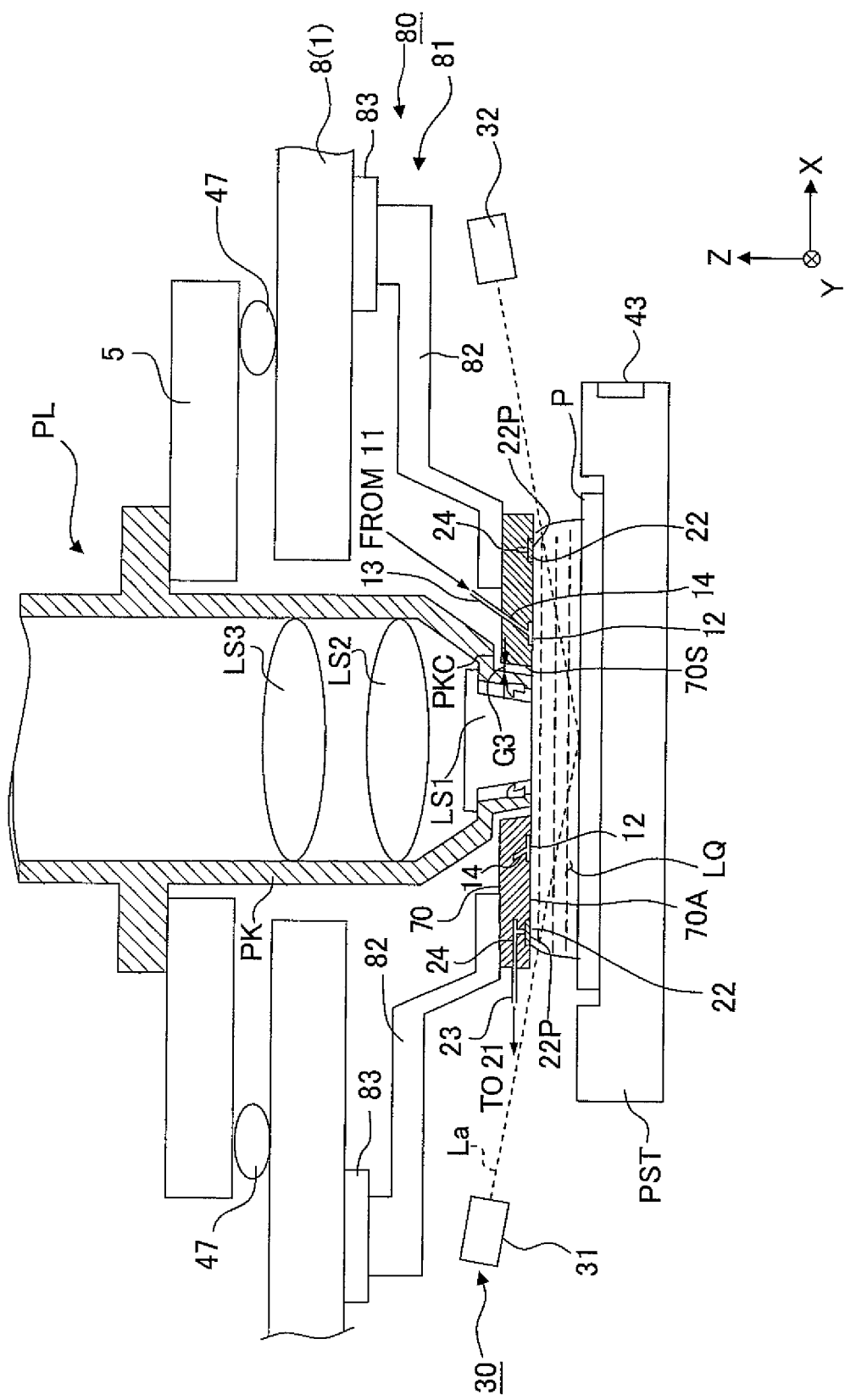
FIG. 6 shows an exposure apparatus according to a second embodiment.

Next, a second embodiment of the present invention will be explained with reference to FIG. 6. In the following description, the constitutive components, which are the same as or equivalent to those of the embodiment described above, are designated by the same reference numerals, any explanation of which will be simplified or omitted.

The feature of the second embodiment is that the nozzle member 70 is constructed of a single member, and the supply port 12 for supplying the liquid LQ and the recovery port 22 for recovering the liquid LQ are provided on the lower surface 70A of the nozzle member 70. With reference to FIG. 6, the nozzle member 70 is an annular member formed to surround the projection optical system PL. A predetermined gap G3 is provided between the outer side surface PKC of the barrel PK of the projection optical system PL and the inner side surface 70S of the nozzle member 70. The gap G3 prevents the vibration from being directly transmitted to the projection optical system PL, even when the vibration is generated in the nozzle member 70 due to the supply and the recovery of the liquid LQ. The nozzle member 70 is supported by the lower stepped portion 8 of the main column 1 via the support mechanism 81 having the driving mechanisms 83. When the substrate P is to be subjected to the scanning exposure, the control unit CONT adjusts at least one of the position and the posture of the nozzle member 70 based on the detection result of the focus/leveling-detecting system 30. Even when the nozzle member 70 is constructed of the single member as described above, it is possible to avoid the outflow of the liquid LQ and to prevent the bubble from entering into and mixing with the liquid immersion area AR2 by adjusting at least any one of the position and the posture of the nozzle member 70 depending on the surface position of the substrate P.

Third Embodiment

Figure 7:
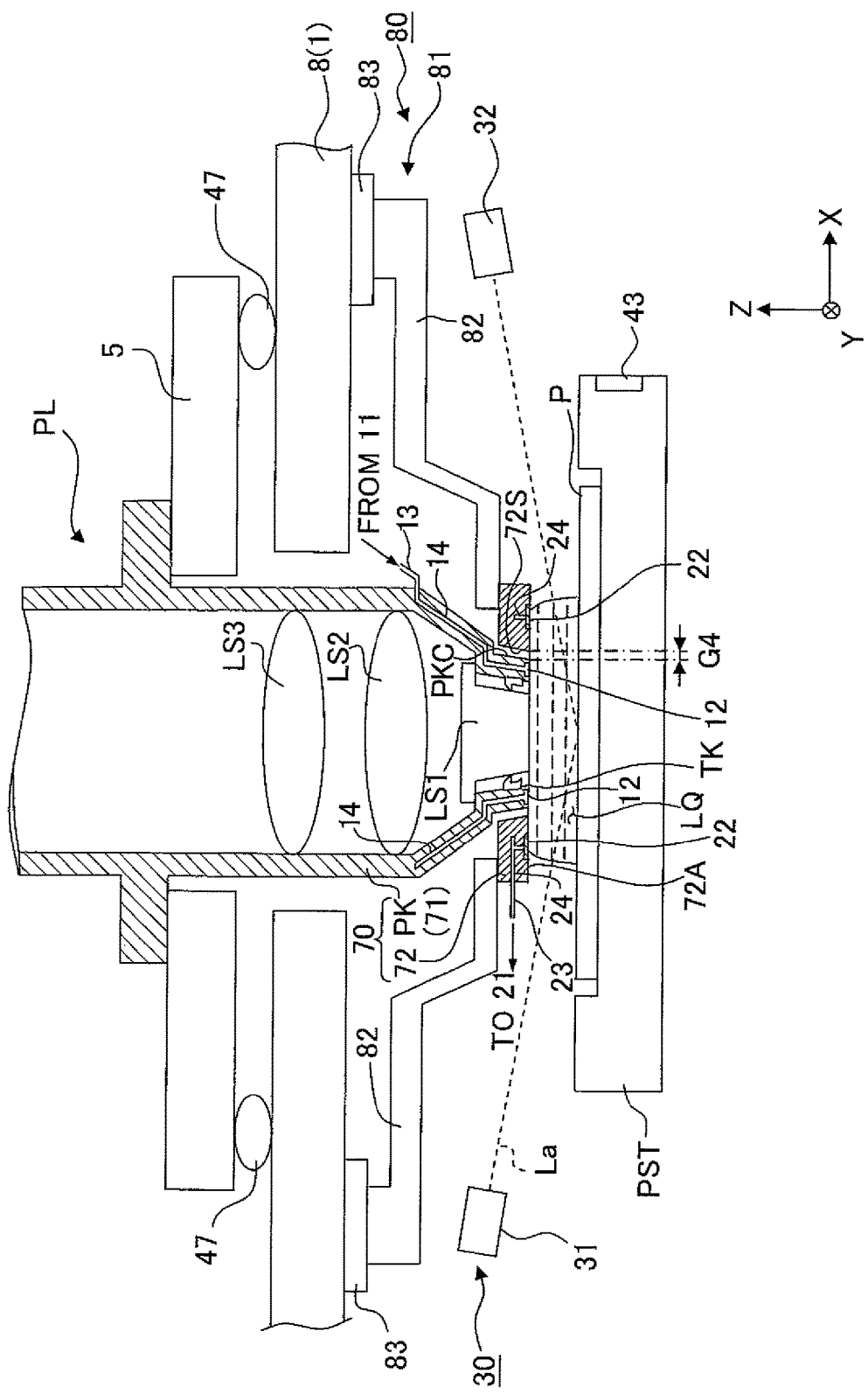
FIG. 7 shows an exposure apparatus according to a third embodiment.

Next, a third embodiment of the present invention will be explained with reference to FIG. 7. A difference between the third embodiment and the first embodiment, i.e., the feature of the third embodiment is that the supply port 12 for supplying the liquid LQ is provided on the lower surface TK of the barrel PK, and the internal flow passage 14, which connects the supply port 12 and the supply tube 13, is provided in the barrel PK. That is, in this embodiment, the first nozzle member for supplying the liquid LQ is included in the barrel PK which holds the optical element LS1 constructing the projection optical system PL. The second nozzle member 72 is provided to surround the barrel PK having the supply port 12. The second nozzle member 72 has the recovery port 22 on the lower surface 72A thereof. The second nozzle member 72 is supported by the lower stepped portion 8 of the main column 1 via the support mechanism 81. The second nozzle member 72 is an annular member formed to surround the projection optical system PL. A predetermined gap G4 is defined between the outer side surface PKC of the barrel PK of the projection optical system PL and the inner side surface 72S of the second nozzle member 72. Even when any vibration is generated in the second nozzle member 72 due to the recovery of the liquid LQ via the recovery port 22, the gap G4 prevents the vibration from being directly transmitted to the projection optical system PL. On the other hand, as described above, the vibration is small when the liquid LQ is supplied onto the substrate P via the supply port 12. Therefore, even when the supply port 12 is formed in the barrel PK, any vibration, having such an extent that the exposure accuracy is affected thereby, is hardly generated in the barrel PK due to the supply of the liquid LQ. When the supply port 12 is provided on the barrel PK, it is possible to decrease the size of the liquid immersion area AR2. As the liquid immersion area AR2 is made to be small, it is possible to shorten the movement stroke of the substrate stage PST. Consequently, it is possible to reduce the size of the exposure apparatus EX as a whole.

Fourth Embodiment

Figure 8:
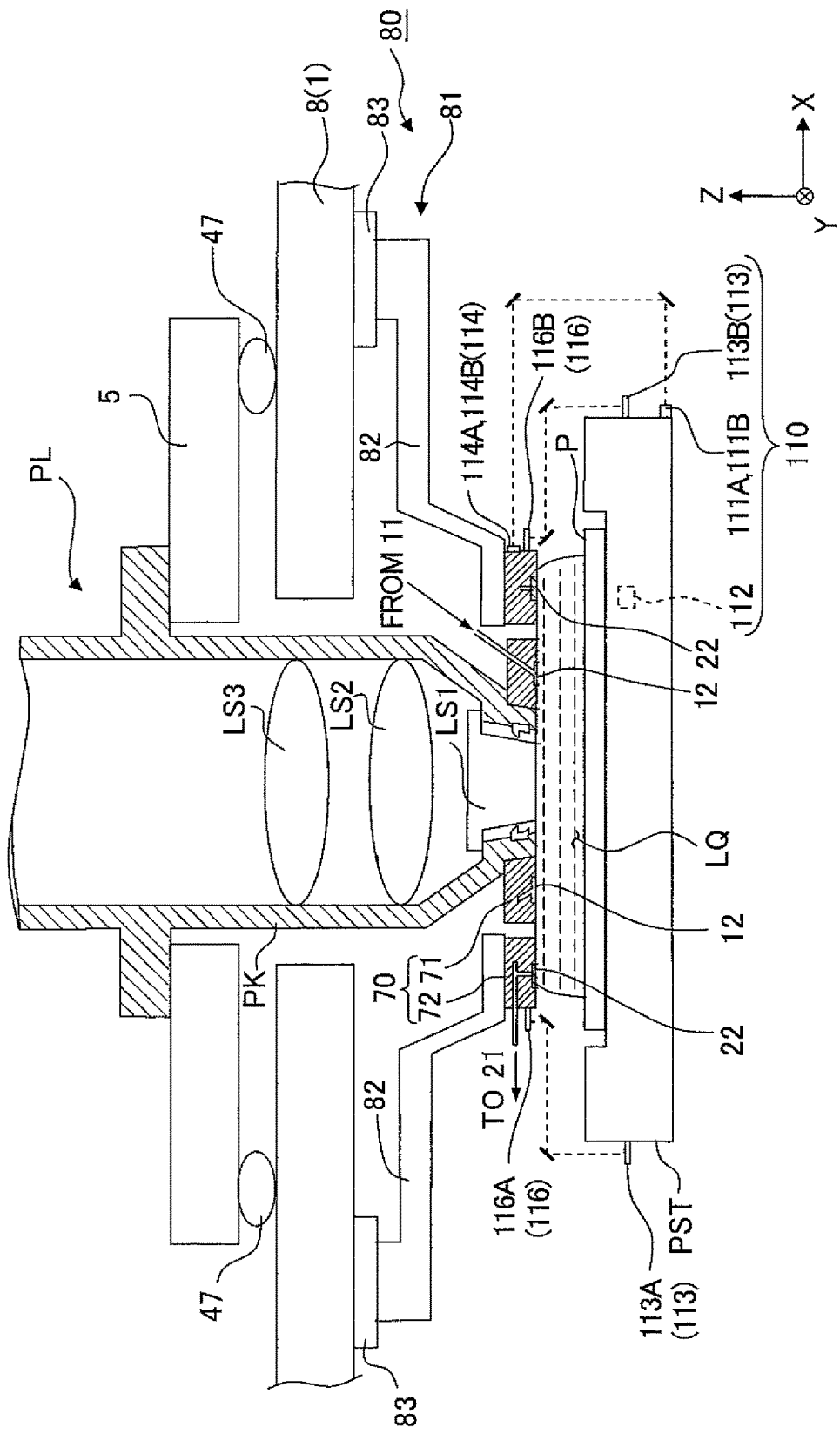
FIG. 8 shows an exposure apparatus according to a fourth embodiment.

Next, a fourth embodiment of the present invention will be explained with reference to FIG. 8. The fourth embodiment is different from the first embodiment in that, i.e., the feature of the fourth embodiment is that an exposure apparatus EX of the fourth embodiment is provided with a detector 110 which detects the relative positional relationship between the nozzle member 70 (second nozzle member 72) and the substrate stage PST. The control unit CONT adjusts at least one of the position and the posture of the second nozzle member 72 based on the detection result of the detector 110.

The detector 110 includes an X interferometer 111 which measures a positional relationship between the substrate stage PST and the second nozzle member 72 in relation to the X axis direction, a Y interferometer 112 which measures a positional relationship between the substrate stage PST and the second nozzle member 72 in relation to the Y axis direction, and a Z interferometer 113 which measures a positional relationship between the substrate stage PST and the second nozzle member 72 in relation to the Z axis direction. The interferometers 111 to 113 are provided at predetermined positions respectively, of the substrate stage PST, at which the exposure process is not disturbed. In FIG. 8, the interferometers 111 to 113 are provided on side surfaces of the substrate stage PST respectively.

The detector 110 is provided with a plurality of (two) pieces of X interferometer 111 (111A, 111B). Specifically, the detector 110 is provided with two pieces of X interferometers 111A, 111B which are provided on a side surface of the substrate stage PST to be aligned in the Y axis direction. Reflecting surfaces 114 (114A, 114B), which correspond to the X interferometers 111A, 111B respectively, are provided on a side surface of the second nozzle member 72. Measuring beams of the X interferometers 111 are radiated onto the reflecting surfaces 114 via reflecting mirrors. The control unit CONT can determine the position of the second nozzle member 72 in relation to the X axis direction with respect to the substrate stage PST based on the measurement result of at least any one of the X interferometers 111A, 111B. In addition, the control unit CONT can determine the position of the second nozzle member 72 in the θZ direction with respect to the substrate stage PST based on the respective measurement results of the plurality of X interferometers 111A, 111B.

The detector 110 is provided with the single Y interferometer 118. Specifically, the detector 110 is provided with the Y interferometer 118 which is provided on a side surface of the substrate stage PST. A reflecting surface (not shown), which corresponds to the Y interferometer, is provided on a side surface of the second nozzle member 72. The control unit CONT can determine the position of the second nozzle member 72 in relation to the Y axis direction with respect to the substrate stage PST based on the measurement result of the Y interferometer.

The detector 110 is provided with a plurality of (three) pieces of Z interferometer 111. Specifically, the detector 110 is provided with Z interferometers 113A, 113B which are provided on side surfaces of the substrate stage PST to be aligned in the X axis direction, and a Z interferometer 113C (not shown in FIG. 8) which is provided at the position aligned in relation to the Y axis direction with respect to the Z interferometer 113B. Reflecting surfaces 116 (116A, 116B, 116C), which correspond to the Z interferometers 113A, 113B, 113C respectively, are provided on side surfaces of the second nozzle member 72. Measuring beams of the Z interferometers 113 are radiated onto the reflecting surfaces 116 via reflecting mirrors. The control unit CONT can determine the position of the second nozzle member 72 in relation to the Z axis direction with respect to the substrate stage PST based on the measurement result of at least any one of the Z interferometers 113A, 113B, 113C. In addition, the control unit CONT can determine the positions of the second nozzle member 72 in the θX direction and the θY direction with respect to the substrate stage PST, i.e., the inclination of the second nozzle member 72 with respect to the substrate stage PST, based on the measurement results of at least any two of the plurality of Z interferometers 113A, 113B, 113C.

As described above, the control unit CONT can determine the position of the second nozzle member 72 with respect to the substrate stage PST in relation to the directions of six degrees of freedom (X axis, Y axis, Z axis, θX, θY, and θZ directions) based on the measurement results of the plurality of interferometers 111 to 113.

The numbers and the arrangements of the X interferometer(s), the Y interferometer(s), and the Z interferometer(s) can be arbitrarily set. For example, one piece of the X interferometer may be provided, and two pieces of the Y interferometers may be provided. In principle, it is enough that the construction is made such that the position of the second nozzle member 76 in relation to the directions of six degrees of freedom (at least Z position, θX, θY) can be measured by using a plurality of interferometers. As for the detector 110, there is no limitation to the interferometer. It is also possible to use any position-measuring unit having any other construction including, for example, a capacitance sensor, an encoder or the like.

Each of the interferometers 111 to 113 is connected to the control unit CONT. The measurement result of each of the interferometers 111 to 113 is outputted to the control unit CONT. The control unit CONT can determine the position of the second nozzle member 72 with respect to the substrate stage PST in relation to the directions of six degrees of freedom (X axis, Y axis, Z axis, θX, θY, and θZ directions) based on the measurement results of the plurality of interferometers 111 to 113. The control unit CONT drives the driving mechanisms 83 during the scanning exposure for the substrate P based on the determined position information to adjust the positional relationship between the substrate stage PST and the second nozzle member 72. In this case, the information, which relates to an optimum positional relationship between the substrate stage PST and the second nozzle member 72, is previously stored in the storage unit MRY connected to the control unit CONT. The control unit CONT adjusts at least one of the position and the posture of the second nozzle member 72 during the scanning exposure for the substrate P based on the storage information stored in the storage unit MRY so that the optimum positional relationship is maintained between the substrate stage PST and the second nozzle member 72 based on the detection result of the detector 100.

In the fourth embodiment, the storage unit MRY of the control unit CONT stores the information to be used in order that the distance between the surface of the substrate P and the lower surface 72A of the second nozzle member 72 is L1 (about 1 mm), and that the surface of the substrate P and the lower surface 72A are substantially parallel to each other.

As described above, the control unit CONT adjusts at least one of the position and the posture of the second nozzle member 72 (nozzle member 70) based on the position information about the substrate stage PST detected by the detector 110, without using the detection result of the focus/leveling-detecting system 30, so that the positional relationship between the lower surface 72A of the second nozzle member 72 and the surface of the substrate P can be maintained in the desired state. Alternatively, at least one of the position and the posture of the second nozzle member 72 (nozzle member 70) may be adjusted based on the detection result of the focus/leveling-detecting system 30 and the detection result of the detector 110 to maintain the positional relationship between the lower surface 72A of the second nozzle member 72 and the surface of the substrate P to be in the desired state. Further alternatively, the detector 110 of this embodiment may be provided for the exposure apparatus EX of the second embodiment described above to adjust at least one of the position and the inclination of the nozzle member 70. Still alternatively, the detector 110 of this embodiment may be provided for the exposure apparatus EX of the third embodiment described above to adjust at least one of the position and the inclination of the second nozzle member 72.

Fifth Embodiment

Next, a fifth embodiment of the present invention will be explained with reference to FIG. 9. The feature of the fifth embodiment is that a nozzle-adjusting mechanism 80', which is provided to maintain at least one of a relative distance and a relative inclination between the lower surface 70A of the nozzle member 70 and the surface of the substrate P to be in a predetermined state, includes a gas blow mechanism 150 which has blow ports 151 for blowing the gas against portions, of the surface of the substrate P (substrate portions), located outside the liquid immersion area AR2.

Figure 9:
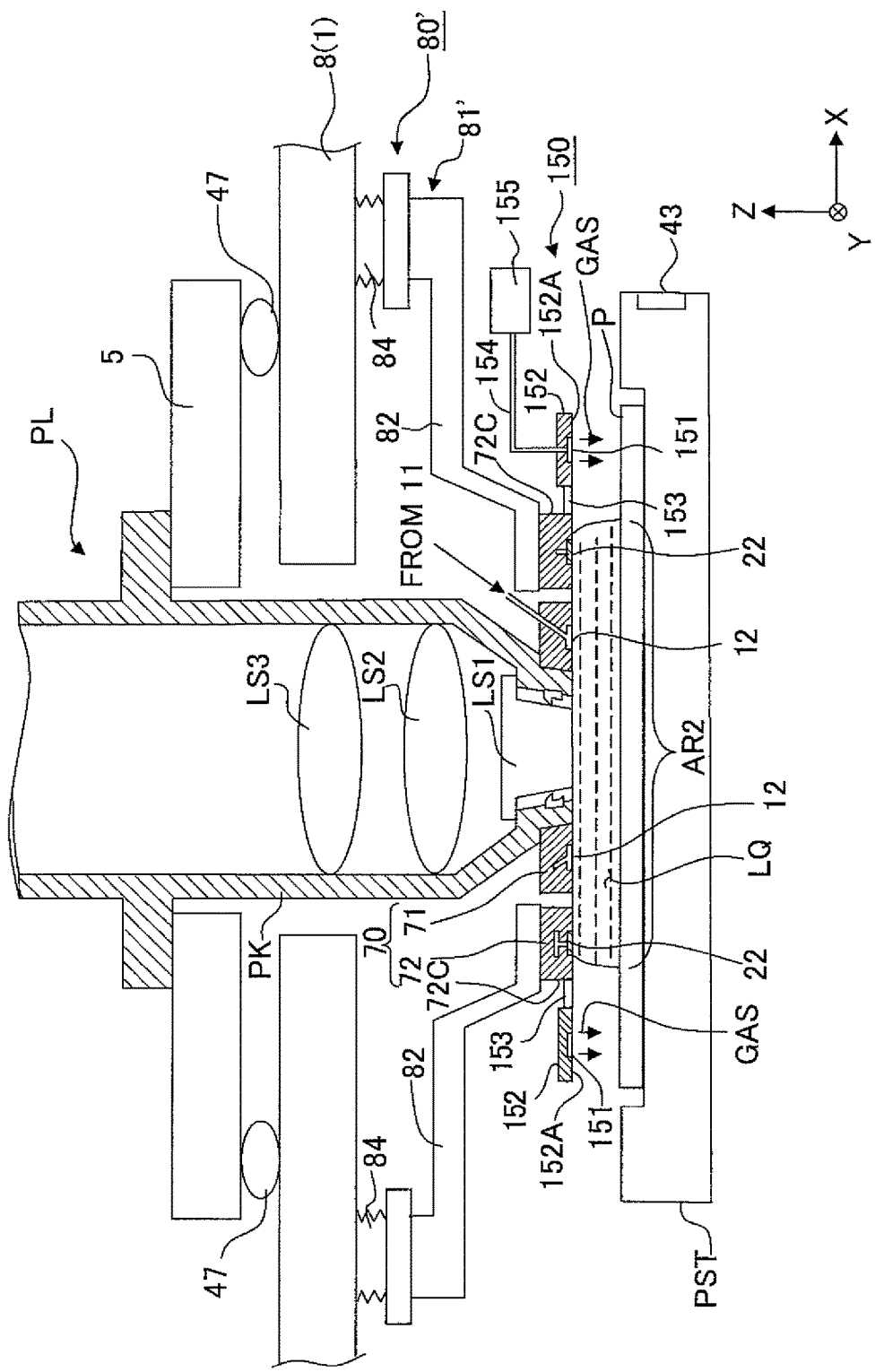
FIG. 9 shows an exposure apparatus according to a fifth embodiment.

With reference to FIG. 9, the first nozzle member 71, which has the supply port 12 for supplying the liquid LQ, is connected to the barrel PK of the projection optical system PL without any gap. The second nozzle member 72, which has the recovery port 22 for recovering the liquid LQ, is supported by the lower stepped portion 8 of the main column 1 via a support mechanism 81'. The support mechanism 81' is provided with connecting members 82, and passive anti-vibration mechanisms 84 which are provided between the lower stepped portion 8 and the upper ends of the connecting members 82. Each of the passive anti-vibration mechanisms 84 is constructed to include, for example, an air spring or a coil spring. That is, the support mechanism 81' of this embodiment does not have any driving mechanism 83 including any actuator. The lower end of the connecting member 82 is connected to the upper surface of the second nozzle member 72.

Blow members 152, which have lower surfaces 152A opposite to (facing) the surface of the substrate P, are connected to an outer side surface 72C of the second nozzle member 72 via connecting members 153 respectively. The lower surfaces 152A of the blow members 152 are substantially flush with the lower surface 70A (71A, 72A) of the nozzle member 70. The blow port 151, from which the gas is blown against the surface of the substrate P, is provided on the lower surface 152A of each of the blow members 152. The gas blow mechanism 150 has a gas supply section 155. The gas, which is supplied from the gas supply section 155, is blown from the blow ports 151 via a supply tube 154. The liquid immersion mechanism 100 locally forms the liquid immersion area AR2 of the liquid LQ on the substrate P in the same manner as in the embodiment described above. However, the blow ports 151 of the gas blow mechanism 150 allow the gas to be blown against the surface portions of the substrate P outside the liquid immersion area AR2 formed by the liquid immersion mechanism 100. The blow ports 151 of the gas blow mechanism 150 are provided so that the gas is allowed to be blown against the portions in the vicinity of the edge portion of the liquid immersion area AR2.

Figure 10:
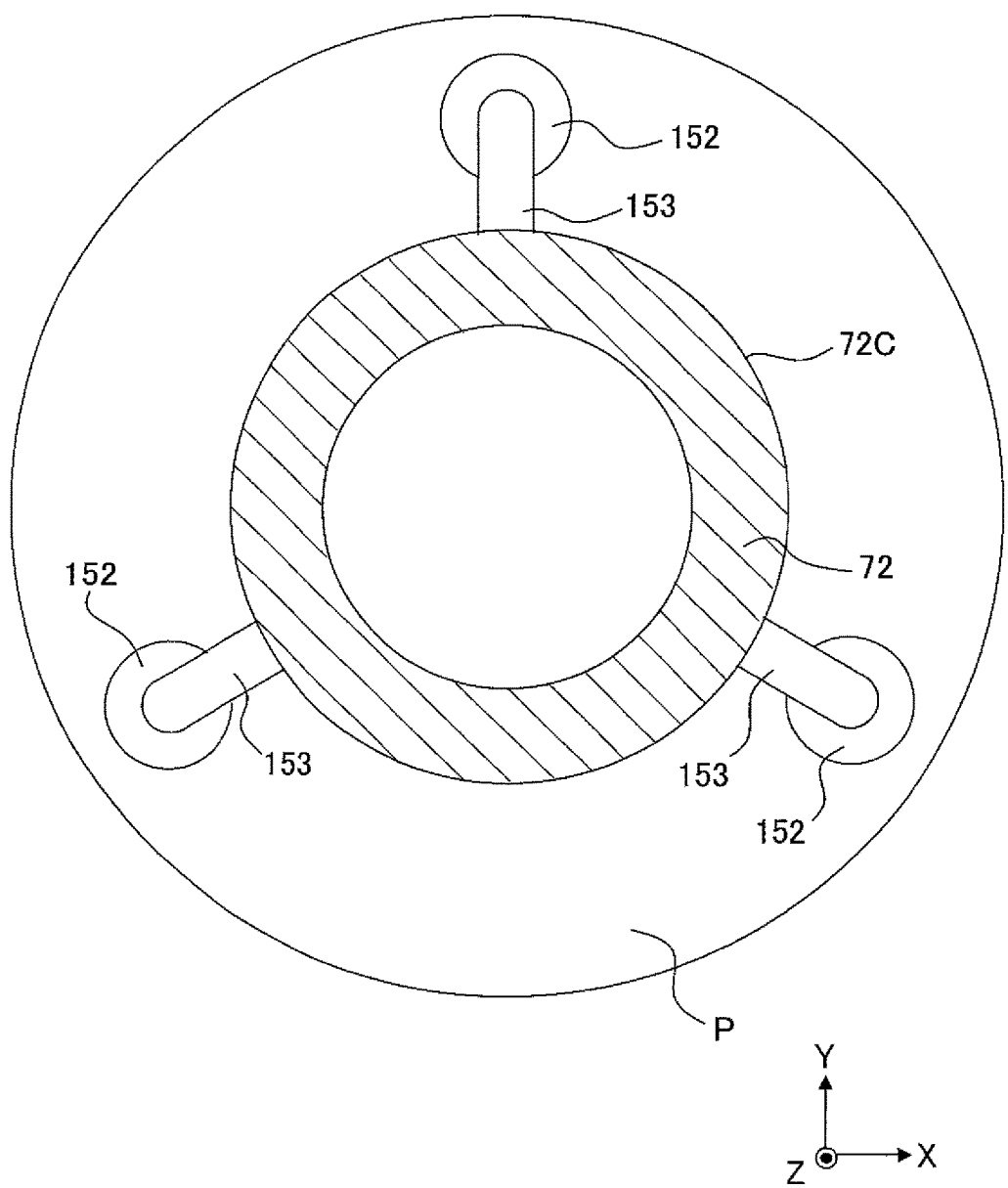
FIG. 10 shows a plan view schematically illustrating a positional relationship between a substrate and blow members connected to a nozzle member.

FIG. 10 shows a plan view schematically illustrating a relationship between the substrate P and the blow members 152 connected to the outer side of the second nozzle member 72. As shown in FIG. 10, three pieces of connecting members 153 are provided. The respective connecting members 153 are arranged at approximately equal intervals (120° intervals) in the circumferential direction (θZ direction) of the second nozzle member 72. The three blow members 152, which are connected to the connecting members 153, are also provided at approximately equal intervals (120° intervals), and are arranged to surround the second nozzle member 72. Therefore, the plurality of blow ports 151, which are disposed on the lower surfaces 152A of the blow members 152, are provided to surround the second nozzle member 72. The gas supply amounts (gas blow amounts) per unit time, which are blown from the plurality of blow ports 151 respectively, are set to have an approximately same value.

The nozzle-adjusting mechanism 80' supports the second nozzle member 72 connected to the blow members 152 via the connecting members 153 so that the second nozzle member 72 floats above the substrate P by a force of the gas blown against the surface of the substrate P from the blow ports 151 provided for the blow members 152 of the gas blow mechanism 150. The second nozzle member 72, which is supported in the floating manner with respect to the substrate P, is maintained in terms of the relative distance and the relative inclination with respect to the surface of the substrate P. Therefore, when the surface position of the substrate P is changed during the scanning exposure for the substrate P, the nozzle-adjusting mechanism 80', which includes the gas blow mechanism 150, is capable of allowing at least one of the position and the posture of the second nozzle member 72 supported in the floating manner with respect to the substrate P to follow the change of the surface position of the substrate P. The passive anti-vibration mechanism 84, which includes the air spring or the coil spring, is provided between the lower stepped portion 8 of the main column 1 and the connecting member 82 connected to the second nozzle member 72. Therefore, the second nozzle member 72 is swingable with respect to the lower stepped portion S of the main column 1 by the passive anti-vibration mechanism 84. Therefore, the second nozzle member 72 is not prevented from moving to follow the surface position of the substrate P. The surface position of the substrate P can be detected by the focus/leveling-detecting system or any other detecting system in the same manner as in the embodiment described above.

In this embodiment, the gas blow mechanism 150 allows the gas to be blown against the portions in the vicinity of the edge portion of the liquid immersion area AR2. It is possible to suppress the expansion of the liquid immersion area AR2 and the outflow of the liquid LQ of the liquid immersion area AR2, owing to the flow of the gas, because the gas is blown against the portions in the vicinity of the edge portion of the liquid immersion area AR2. There is such a possibility that the gas (bubble) enters into and mixed with the liquid immersion area AR2 via the edge portion of the liquid immersion area AR2, because the gas flows in the vicinity of the liquid immersion area AR2. However, the recovery port 22 is provided in the vicinity of the edge portion of the liquid immersion area AR2. Therefore, even when the bubble enters into and mixed with the liquid immersion area AR2 via the edge portion of the liquid immersion area AR2, the bubble is immediately recovered from the recovery port 22. In addition, as explained with reference to FIG. 5, the flow of the liquid LQ supplied from the supply port 15 also prevents the inflow of the bubble into the optical path for the exposure light beam EL, the bubble being entered into and mixed with the liquid immersion area AR2 via the edge portion of the liquid immersion area AR2. It is of course possible that the blow port 151 for allowing the gas to be blown is provided at any position away from the liquid immersion area AR2. By doing so, it is possible to reduce the possibility that the gas (bubble) enters into and mixes with the liquid immersion area AR2.

In this embodiment, the three blow members 152 are provided. However, the number and the arrangement of the blow members 152 can be arbitrarily set provided that the second nozzle member 72 can be supported in the floating manner with respect to the substrate P. Alternatively, the blow member 152 may be an annular member which surrounds the second nozzle member 72. Blow ports 151 may be provided respectively at a plurality of predetermined positions of the lower surface 152A of the blow member 152 provided in the annular form. In this embodiment, the blow members 152 having the blow ports 151 are connected to the second nozzle member 72. However, for example, the blow member 152 having the blow port 151 may be connected to the nozzle member 70 having both of the supply port 12 and the recovery port 22 as explained with reference to FIG. 6. It is not necessarily indispensable that the lower surface 70A of the nozzle member 70 and the lower surface 152A of the blow member 152 are flush with each other under a condition in which the liquid immersion area AR2 is formed satisfactorily.

Sixth Embodiment

Figure 11:
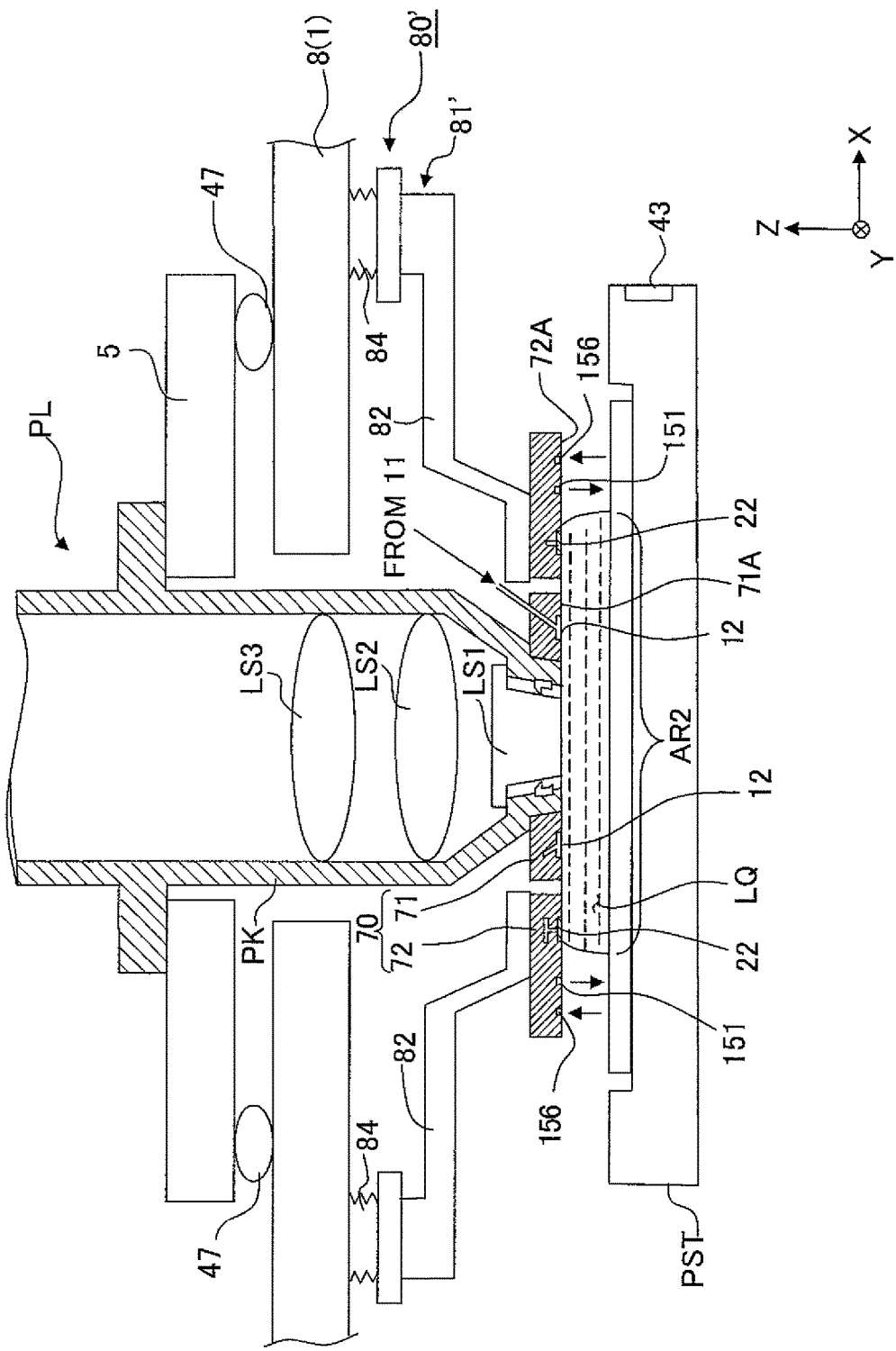
FIG. 11 shows an exposure apparatus according to a sixth embodiment.

Next, a sixth embodiment of the present invention will be explained with reference to FIG. 11. The feature of the sixth embodiment is that blow ports 151 for blowing the gas are provided on the lower surface 70A of the nozzle member 70. More specifically, the blow ports 151 are provided on the lower surface 72A of the second nozzle member 72, and are provided outside the recovery port 22 with respect to the optical axis AX of the projection optical system PL. In addition, suction ports 156 for sucking the gas are provided outside the blow ports 151. The nozzle-adjusting mechanism 80' maintains the relative distance and the relative inclination between the lower surface 72A of the second nozzle member 72 and the surface of the substrate P to be in a predetermined state by a balance between the gas blown from the blow ports 151 and the gas sucked via the suction ports 156. As described above, it is also possible to provide the blow ports 151 and the suction ports 156 on the lower surface 70A of the nozzle member 70. In this embodiment, the second nozzle member 72 can be supported satisfactorily in the floating manner with respect to the substrate P, because the suction ports 156 for sucking the gas are provided. The suction ports 156 are provided outside the liquid immersion area AR2 (at the positions away from the liquid immersion area AR2) with respect to the blow ports 151. Therefore, the inflow of the liquid LQ into the suction ports 156 is suppressed. It is of course allowable that the suction port 156 is provided between the blow port 151 and the recovery port 22. The suction port 156 may be provided on the lower surface 152A of the blow member 152 as explained with reference to, for example, FIG. 9. Further, the blow port 151 and the suction port 156 may be provided on the lower surface 70A of the nozzle member 70 having both of the supply port 12 and the recovery port 22 as explained with reference to FIG. 6. In the lower surface 72A of the second nozzle member 72 shown in FIG. 11, it is not necessarily indispensable that a surface portion, on which the blow port 151 is formed, is flush with a surface portion on which the recovery port 22 is formed, provided that the liquid immersion area AR2 is formed satisfactorily. In the sixth embodiment also, the surface position of the substrate P can be detected by using the focus/leveling-detecting system or any other detecting system as in the embodiment described above. The support mechanism 81 adopted in the first to fourth embodiments may be used in combination with the blow port 151 and/or the suction port 156 adopted in the fifth and sixth embodiments.

The first to sixth embodiments described above are illustrative of a case in which the positional relationship between the surface of the substrate P and the lower surface of the nozzle member (70 or 72) is maintained to be in the desired state when the liquid immersion area AR2 is formed on the substrate P. However, at least one of the position and the posture of the nozzle member (70, 72) can be adjusted in conformity with the change in the surface position of the surface of the object arranged opposite to the nozzle member (70, 72), for example, when the liquid immersion area AR2 is formed on the substrate stage PST or when the liquid immersion area AR2 is formed in a region ranging over the substrate P and the substrate stage PST. Therefore, if necessary, it is possible to execute the adjustment of at least one of the position and the posture (inclination) of the nozzle member (70, 72) during various types of operations in which the liquid immersion area AR2 of the liquid LQ is formed on the side of the image plane of the projection optical system PL, without being limited to the period in which the substrate P is subjected to the scanning exposure.

In the first to sixth embodiments described above, at least one of the position and the posture of the nozzle member is adjusted so that the surface of the object (substrate P) and the lower surface of the nozzle member (70, 72) are substantially parallel to one another at the predetermined spacing distance. However, the relative distance and the relative inclination between the object (substrate P) and the nozzle member (70, 72) can be adjusted to maintain the liquid immersion area AR2 satisfactorily in consideration of, for example, the viscosity of the liquid LQ, the affinity of the surface of the object (substrate P) for the liquid LQ (contact angle of the liquid LQ on the object surface), and the movement velocity of the object (substrate P).

In the first to fourth embodiments described above, the position of the substrate P or the substrate stage PST is optically detected by using the focus/leveling-detecting system 30 or the detector 100 to adjust at least one of the position and the posture (inclination) of the nozzle member 70 based on the detection result. On the other hand, at least one of the position and the posture (inclination) of the nozzle member (70, 72) can be adjusted without performing the feedback control based on the detection result of, for example, the focus/leveling-detecting system 30. That is, the control unit CONT previously detects the surface position information of the object surface (surface of the substrate P) before the scanning exposure for the substrate P, and the detection result is stored beforehand as a map data in the storage unit MRY. The control unit CONT can adjust at least one of the position and the posture (inclination) of the nozzle member (70, 72) by using the driving mechanisms 83 based on the stored information (map data) stored in the storage unit MRY, without using the focus/leveling-detecting system 30 (or the detector 100). In this case, it is also allowable to omit the focus/leveling-detecting system 30 detecting the surface position information of the surface of the object (substrate P) in the vicinity of the side of the image plane of the projection optical system PL. For example, as disclosed in Japanese Patent Application Laid-open No. 2002-158168, when the surface position information (map data) of the substrate P is to be obtained before the exposure on the measuring station disposed away from the exposure station performing the exposure for the substrate P, at least one of the position and the posture (inclination) of the nozzle member (70, 72) can be adjusted (subjected to the feedforward control) based on the map data.

When the substrate stage PST, which supports the substrate P, is moved in the Z axis direction, the θX direction, and the θY direction based on the driving operation of the substrate stage-driving mechanism PSTD, the control unit CONT may adjust at least one of the position and the posture of the nozzle member 70, 72 by using the driving mechanisms 83 depending on the driving amount of the substrate stage-driving mechanism PSTD. In this case also, the positional relationship between the surface of the object (substrate P) and the lower surface of the nozzle member (70, 72) can be maintained to be in the desired state without performing the feedback control based on the detection result of, for example, the focus/leveling-detecting system 30.

Seventh Embodiment

An exposure apparatus of this embodiment has approximately same components and same structure as those of the exposure apparatus of the third embodiment, except that the barrel of the projection optical system PL is constructed of sub-barrels, and that the support mechanism 81 has no driving mechanism for the nozzle plate. Therefore, in the following description and FIGS. 12 to 15, the constitutive parts of components, which are same as or equivalent to those of the first and third embodiments described above, are designated by the same reference numerals, any explanation of which will be simplified or omitted.

Figure 12:
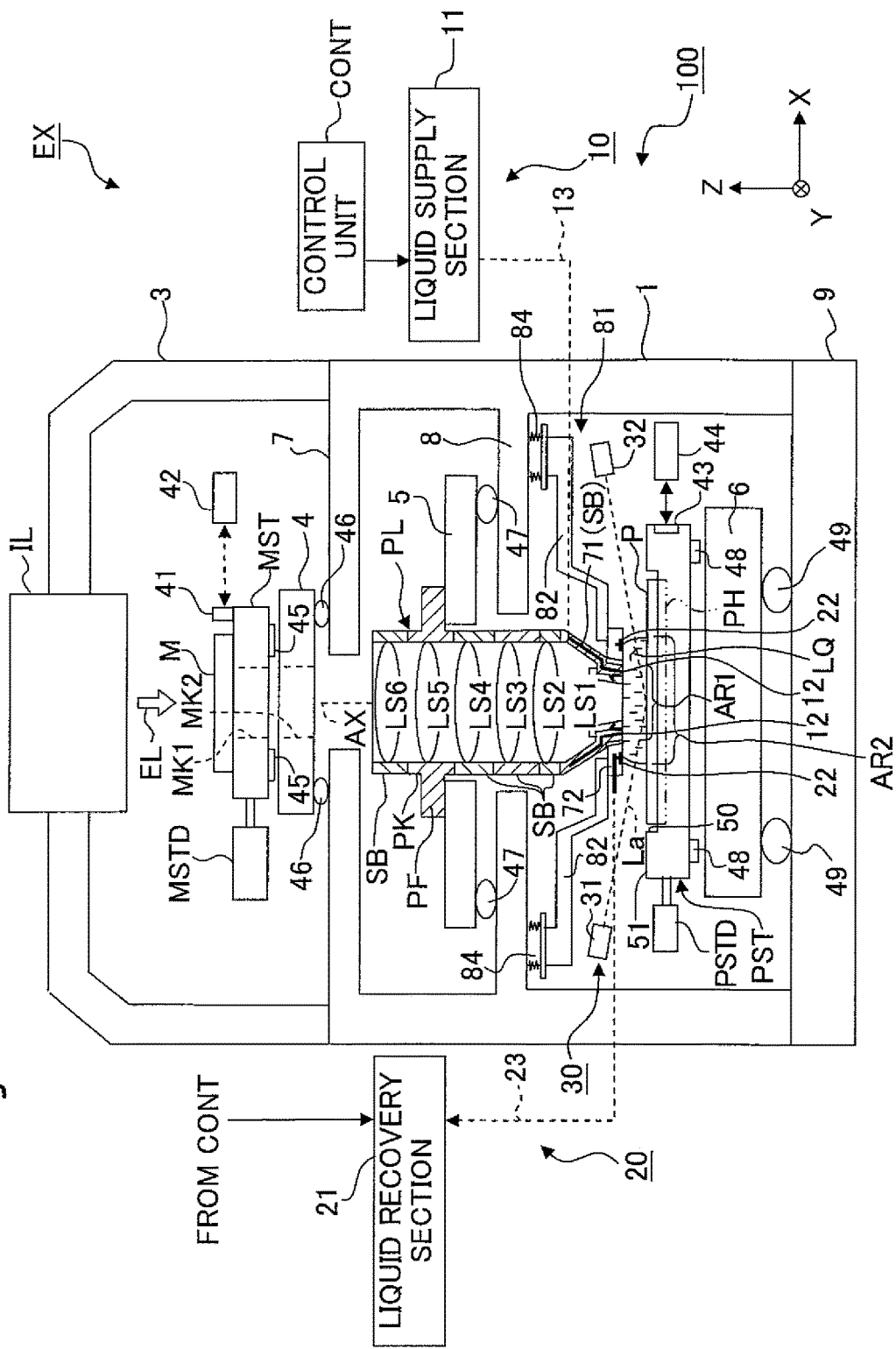
FIG. 12 shows a schematic arrangement illustrating an exposure apparatus according to a seventh embodiment.
Figure 13:
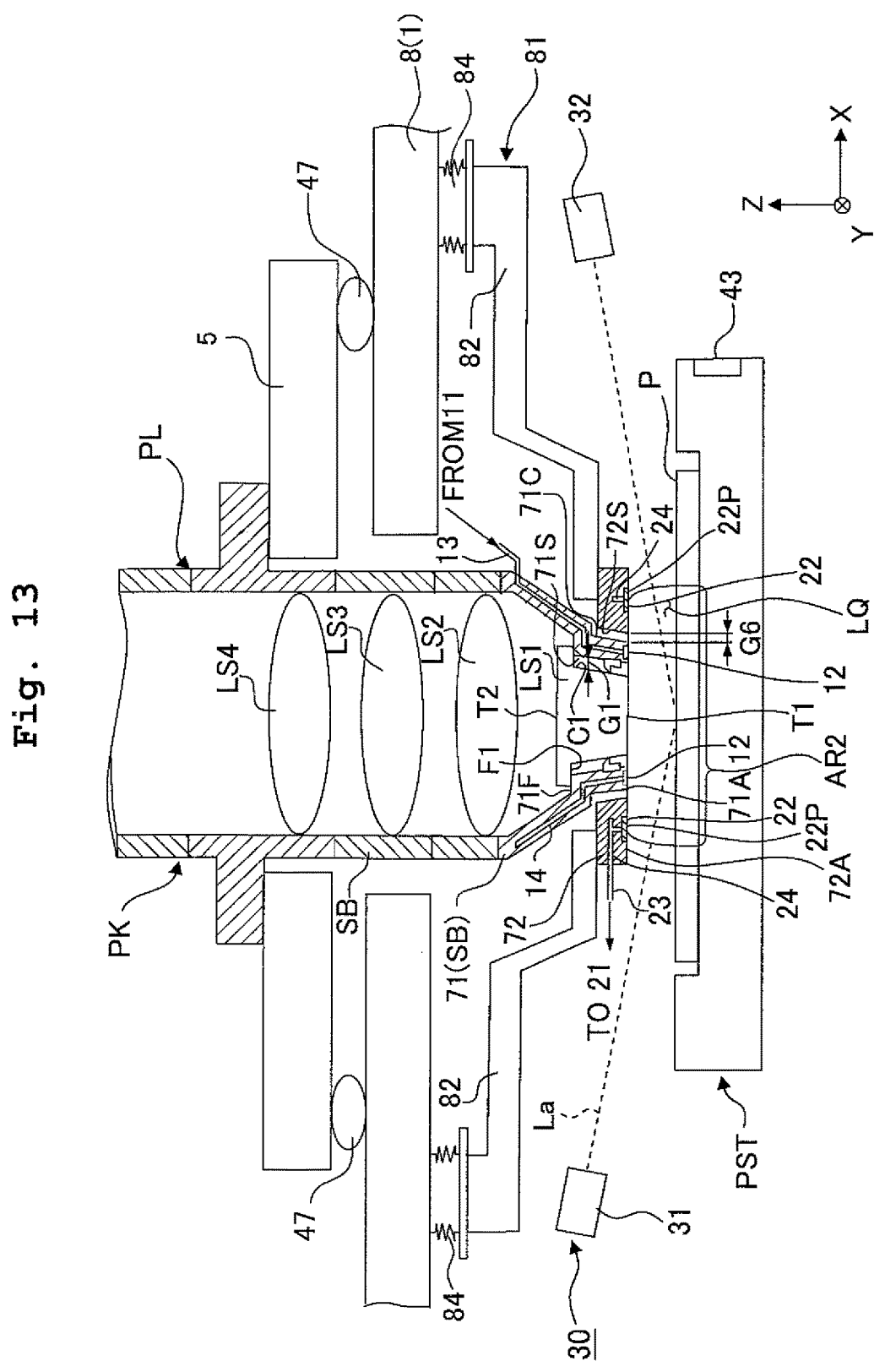

As shown in FIGS. 12 and 13, the first nozzle member 71 of the exposure apparatus EX of this embodiment holds the first optical element LS1 which is arranged closest to the image plane among a plurality of optical elements LS1 to LS6 constructing the projection optical system PL. The first nozzle member 71 constitutes a part of the barrel PK in the same manner as in the third embodiment.

As shown in FIG. 12, the projection optical system PL has the plurality of optical elements LS1 to LS6 including the first optical element LS1 provided at the end portion on a side of the substrate P. The optical elements LS1 to LS6 are held by the barrel PK. The barrel PK is constructed by combining a plurality of divided barrels (sub-barrels) SB. A sub-barrel, which is arranged closest to the image plane of the projection optical system PL (on the −Z side) among the plurality of sub-barrels SB and, is the first nozzle member 71 having the supply ports 12, and holds the first optical element LS1. That is, the first nozzle member 71 is integrated with the sub-barrels SB to construct the barrel PK as a whole.

The second nozzle member 72 is supported by the lower stepped portion 8 of the main column 1 via the support mechanism 81. The support mechanism 81 is provided with connecting members 82, and passive anti-vibration mechanisms 84 which are provided between ends (upper ends) of the connecting members 82 and the lower stepped portion 8. The other ends (lower ends) of the connecting members 82 are connected (fixed) to the upper surface of the second nozzle member 72. The support mechanism 81 supports the second nozzle member 72 in a state in that the nozzle member 72 is away from the first nozzle member 71 (barrel PK).

The second nozzle member 72 is an annular member similarly to the first nozzle member 71. The second nozzle member 72 is provided to surround an outer side surface 71C of the first nozzle member 71 (barrel PK) in the vicinity of the side of the image plane of the projection optical system PL. The second nozzle member 72 is provided away from the first nozzle member 71 (barrel PK). A predetermined gap G6 is provided between the outer side surface 71C of the first nozzle member 71 (barrel PK) and an inner side surface 72S of the second nozzle member 72 supported by the support mechanism 81.

The supply ports 12 for supplying the liquid LQ onto the substrate P are provided on the lower surface 71A of the first nozzle member 71. The recovery port 22 is formed to have, for example, an annular slit-shaped form to surround the optical axis AX of the projection optical system PL on the lower surface 72A of the second nozzle member 72. In this embodiment, a porous member (mesh member) 22P is arranged in the recovery port 22.

Figure 14:
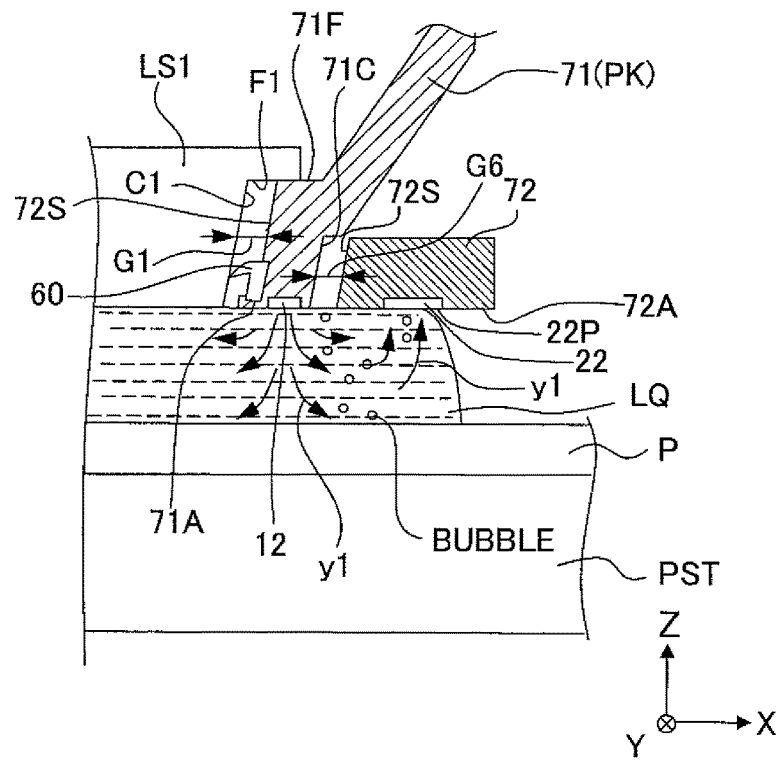
FIG. 14 schematically illustrates the behavior of the liquid of the liquid immersion area in the seventh embodiment.

A possibility is assumed such that the gas existing in the gap G6 enters into and mixes with the liquid LQ of the liquid immersion area AR2. However, the gap G6 is provided further outside, than the supply ports 12, with respect to the optical path for the exposure light beam EL (projection area AR1). As schematically shown in FIG. 14, a part of the liquid LQ supplied from the supply ports 12 forms the flow of the liquid directed to the outside of the supply ports 12 (see arrows y1 shown in FIG. 14). Therefore, even when any bubble is mixed from the gap G6 into the liquid LQ of the liquid immersion area AR2, the bubble can be moved to the outside of the optical path for the exposure light beam EL by the flow of the part of the liquid LQ supplied from the supply ports 12.

Figure 15:
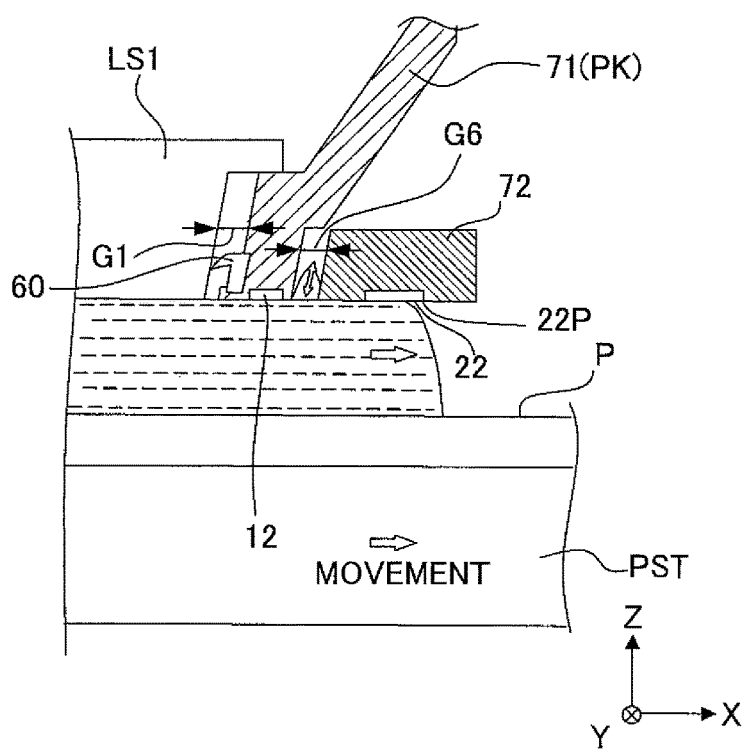
FIG. 15 schematically illustrates the behavior of the liquid of the liquid immersion area in the seventh embodiment.

As the substrate P is moved to perform the scanning exposure, there is such a possibility that the liquid LQ of the liquid immersion area AR2, between the substrate P and the lower surface T1 of the projection optical system PL and the lower surfaces 71A, 72A of the first and second nozzle members 71, 72, is moved as if the liquid LQ is pulled by the moving substrate P. For example, as shown in FIG. 15, there is such a possibility that a part of the liquid LQ of the liquid immersion area AR2 is moved in the +X direction in accordance with the movement of the substrate P in the +X direction. However, the gap G6 is formed between the first nozzle member 71 and the second nozzle member 72, and the upper end of the gap G6 is open to the atmospheric air. Therefore, the liquid LQ can enter and exit the gap G6. Therefore, it is possible to suppress the enormous expansion of the liquid immersion area AR2, and even when the size (diameter) of the nozzle member 70 is small, it is possible to suppress the outflow of the liquid LQ to the outside of the recovery port 22.

Eighth Embodiment

Next, an eighth embodiment of the exposure apparatus of the present invention will be explained with reference to FIG. 16. In the following description and FIG. 16, the constitutive parts or components, which are same as or equivalent to those of the first embodiment described above, are designated by the same reference numerals, any explanation of which will be simplified or omitted. An exposure apparatus of this embodiment includes driving mechanisms 383 for driving the second nozzle member in the same manner as in the first embodiment. However, each of the driving mechanisms 383 functions as an active anti-vibration mechanism which suppresses the transmission of the vibration generated in the second nozzle member 72 to the main column 1 (lower stepped portion 8). The driving mechanism 383 is not used to adjust the position and/or the inclination of the second nozzle member depending on the surface position of the object (for example, the substrate P), unlike in the first embodiment. In this embodiment, the driving mechanism 383 will be hereinafter referred to as "active anti-vibration mechanism".

The support mechanism 81' is provided with connecting members 82, and the active anti-vibration mechanisms 383 which are provided between the upper ends of the connecting members 82 and the lower stepped portion 8. The active anti-vibration mechanism 383 actively avoids the vibration for the second nozzle member 72 with respect to the lower stepped portion 8 of the main column 1. The active anti-vibration mechanism 383 includes, for example, an actuator such as a linear motor, a voice coil motor or the like driven, for example, by the Lorentz's force. The voice coil motor or the like, which is driven by the Lorentz's force, has a coil unit and a magnet unit. The coil unit and the magnet unit are driven in a non-contact state. Therefore, when the driving mechanism 383 is constructed of a driving mechanism which is driven by the Lorentz's force of the voice coil motor or the like, it is possible to suppress the generation of the vibration.

Figure 16:
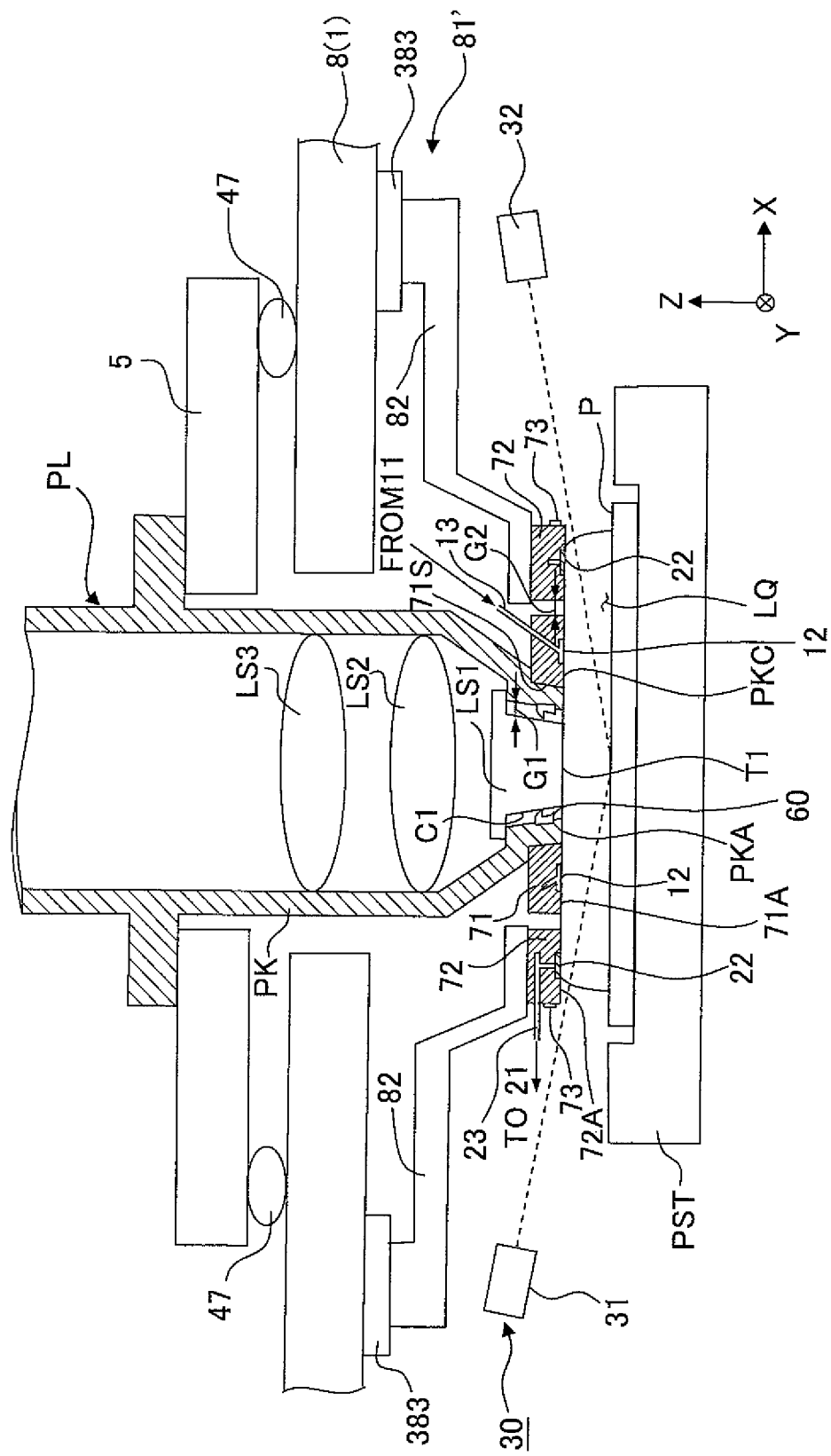
FIG. 16 shows an exposure apparatus according to an eighth embodiment.

The active anti-vibration mechanisms 383 are provided, for example, at six positions (shown in a simplified manner in FIG. 16). The respective operations of the active anti-vibration mechanisms 383 are controlled by the control unit CONT. The control unit CONT uses the active anti-vibration mechanisms 383 so that the second nozzle member 72, which is connected to the connecting members 82, can be appropriately driven in relation to the directions of six degrees of freedom (X axis, Y axis, Z axis, θX, θY, and θZ directions) with respect to the lower stepped portion 8 of the main column 1. The second nozzle member 72 is provided with an acceleration-measuring unit 73 which measures the acceleration information of the second nozzle member 72. The acceleration-measuring unit 73 is provided as a plurality of acceleration-measuring units 73 so that the acceleration information in relation to the directions of six degrees of freedom of the second nozzle member 72 can be measured. The control unit CONT drives the active anti-vibration mechanisms 383 based on the measurement results of the acceleration-measuring units 73 to actively avoid the vibration so that any vibration generated in the second nozzle member 72 is not transmitted to the main column 1 (lower stepped portion 8). The active anti-vibration mechanism 383 also includes a passive anti-vibration member (attenuating member) such as a rubber member, a spring or the like. The passive anti-vibration member can be used to satisfactorily reduce a high frequency component of the vibration which is to be transmitted from the second nozzle member 72 to the main column 1. Further, a relatively low frequency component of the vibration is reduced by driving the active anti-vibration mechanisms 383, to thereby making it possible to obtain the anti-vibration effect in a wide frequency zone by the active anti-vibration mechanisms 383. It is considered that an extremely low frequency component (for example, a frequency component of not more than 1 Hz), among the vibration components of the second nozzle member 72, scarcely affects the pattern transfer accuracy onto the substrate P. Therefore, it is also possible to construct the control system of the active anti-vibration mechanisms 383 so that the anti-vibration control is not performed for such frequency components. Accordingly, it is possible to avoid the oscillation of the control system, and thus the control system can be constructed with a relatively simple and convenient arrangement.

In this embodiment, the vibration is actively avoided based on the acceleration information of the second nozzle member 72. However, it is allowable that, for example, a position-measuring unit, which is capable of measuring the positional relationship between the second nozzle member 72 and the main column 1 (lower stepped portion 8), is provided; and that the vibration is actively avoided by using the active anti-vibration mechanisms 383 based on the measurement result of the position-measuring unit. Alternatively, the vibration may be actively avoided by using the active anti-vibration mechanisms 383 based on both of the measurement result of the acceleration-measuring unit and the measurement result of the position-measuring unit.

The active anti-vibration mechanism 383 can be applied to the exposure apparatus EX of the seventh embodiment described above. Further, the passive anti-vibration mechanism, which is applied to the exposure apparatus of the seventh embodiment described above, can be also applied to the exposure apparatus of the eighth embodiment.

As described above, the liquid LQ is pure water in the embodiments of the present invention. Pure water is advantageous in that pure water is available in a large amount with ease, for example, in a semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash (clean) the surface of the substrate P and the surface of the optical element provided at the end surface of the projection optical system PL. When the purity of pure water supplied from the factory or the like is low, it is also allowable that the exposure apparatus is provided with an ultra pure water-producing unit.

It is approved that the refractive index n of pure water (water) with respect to the exposure light beam EL having a wavelength of about 193 nm is approximately 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is large as described above, it is desirable to use the polarized illumination, because the image formation performance or the imaging performance is deteriorated due to the polarization effect in some cases with the random polarized light which has been hitherto used as the exposure light beam. In this case, it is preferable that the linear polarized illumination, which is adjusted to the longitudinal direction of a line pattern of a line-and-space pattern of the mask (reticle), is effected so that a diffracted light of the S-polarized light component (TE-polarized light component), i.e., the component in the polarization direction along with the longitudinal direction of the line pattern is dominantly allowed to exit from the pattern of the mask (reticle). When the space between the projection optical system PL and the resist coated on the surface of the substrate P is filled with the liquid, the diffracted light of the S-polarized light component (TE-polarized light component), which contributes to the improvement in the contrast, has the high transmittance on the resist surface, as compared with the case in which the space between the projection optical system PL and the resist coated on the surface of the substrate P is filled with the air (gas). Therefore, it is possible to obtain the high image formation performance even when the numerical aperture NA of the projection optical system exceeds 1.0. Further, it is more effective to appropriately combine, for example, a phase shift mask and the oblique incidence illumination method (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the periodic direction of the line-and-space pattern is restricted to one predetermined direction and when a hole pattern is clustered in one predetermined direction. For example, when a phase shift mask of the half tone type having a transmittance of 6% (pattern having a half pitch of about 45 nm) is illuminated by using the linear polarized illumination method and the dipole illumination method in combination, the depth of focus (DOF) can be increased by about 150 nm as compared with a case using the random polarized light provided that the illumination σ, which is prescribed by the circumscribed circle of the two light fluxes forming the dipole on a pupil plane of the illumination system, is 0.95, the radius of each of the light fluxes at the pupil plane is 0.125σ, and the numerical aperture of the projection optical system PL is NA=1.2.

It is also effective to adopt a combination of the linear polarized illumination and the small σ illumination method (illumination method wherein the σ value, which indicates the ratio between the numerical aperture NAi of the illumination system and the numerical aperture NAp of the projection optical system, is not more than 0.4).

For example, when the ArF excimer laser is used as the exposure light beam, and the substrate P is exposed with a fine line-and-space pattern (for example, line-and-space of about 25 to 50 nm) by using the projection optical system PL having a reduction magnification of about ¼, then the mask M acts as a polarizing plate due to the Wave guide effect depending on the structure of the mask M (for example, the pattern fineness and the thickness of chromium), and the diffracted light of the S-polarized light component (TE-polarized light component) exits from the mask M in an amount larger than that of the diffracted light of the P-polarized light component (TM-polarized light component) which lowers the contrast. In this case, it is desirable to use the linear polarized illumination as described above. However, even when the mask M is illuminated with the random polarized light, it is possible to obtain the high resolution performance even when the numerical aperture NA of the projection optical system PL is large, such as 0.9 to 1.3.

When the substrate P is exposed with an extremely fine line-and-space pattern on the mask M, there is such a possibility that the P-polarized light component (TM-polarized light component) is larger than the S-polarized light component (TE-polarized light component) due to the Wire Grid effect. However, for example, when the ArF excimer laser is used as the exposure light beam, and the substrate P is exposed with a line-and-space pattern larger than 25 nm by using the projection optical system PL having a reduction magnification of about ¼, then the diffracted light of the S-polarized light component (TE-polarized light component) exits from the mask M in an amount larger than that of the diffracted light of the P-polarized light component (TM-polarized light component). Therefore, it is possible to obtain the high resolution performance even when the numerical aperture NA of the projection optical system PL is large, i.e., 0.9 to 1.3.

Further, it is also effective to use the combination of the oblique incidence illumination method and the polarized illumination method in which the linear polarization is effected in the tangential (circumferential) direction of a circle having the center of the optical axis as disclosed in Japanese Patent Application Laid-open No. 6-53120, without being limited to only the linear polarized illumination (S-polarized illumination) adjusted to the longitudinal direction of the line pattern of the mask (reticle). In particular, when the pattern of the mask (reticle) includes not only a line pattern extending in one predetermined direction, but the pattern also includes line patterns extending in a plurality of different directions in a mixed manner (line-and-space patterns having different periodic directions are present in a mixed manner), then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well. For example, when a phase shift mask of the half tone type having a transmittance of 6% (pattern having a half pitch of about 63 nm) is illuminated by using, in combination, the zonal illumination method (zonal ratio: ¾) and the polarized illumination method in which the light is linearly polarized in the tangential direction of the circle having the center of the optical axis, the depth of focus (DOF) can be increased by about 250 nm as compared with a case using the random polarized light provided that the illumination σ is 0.95 and the numerical aperture of the projection optical system PL is NA=1.00. In a case of a pattern having a half pitch of about 55 nm and a numerical aperture of the projection optical system NA=1.2, the depth of focus can be increased by about 100 nm.

In addition to the various types of illumination methods as described above, it is also effective to adapt the progressive multi-focal exposure method disclosed, for example, in Japanese Patent Application Laid-open Nos. 4-277612 and 2001-345245 and the multiwavelength exposure method in which a same or equivalent effect as that of the progressive multi-focal exposure method is obtained by using the multiwavelength (for example, two-wavelength) exposure light beam.

In the embodiment of the present invention, the optical element LS1 is attached to the end portion of the projection optical system PL. Such a lens makes it possible to adjust the optical characteristics of the projection optical system PL, for example, the aberration (for example, spherical aberration, coma aberration and the like). The optical element, which is attached to the end portion of the projection optical system PL, may be an optical plate which is usable to adjust the optical characteristics of the projection optical system PL.

When the pressure, which is generated by the flow of the liquid LQ, is large between the substrate P and the optical element at the end portion of the projection optical system PL, it is also allowable that the optical element is tightly fixed so that the optical element is not moved by the pressure, instead of making the optical element to be exchangeable.

In the embodiment of the present invention, the space between the projection optical system PL and the surface of the substrate P is filled with the liquid LQ. However, for example, it is also allowable that the space is filled with the liquid LQ in such a state that a cover glass constructed of a plane-parallel is attached to the surface of the substrate P.

In the case of the projection optical system concerning each of the embodiments described above, the optical path space on the side of the image plane of the optical element arranged at the end portion, is filled with the liquid. However, it is also possible to adopt such a projection optical system that the optical path space on the side of the mask in relation to the optical element arranged at the end portion, is also filled with the liquid, as disclosed in International Publication No. 2004/019128.

In the embodiments described above, the explanation has been made as exemplified by the exposure apparatus provided with the projection optical system by way of example. However, the present invention is also applicable to the exposure apparatus of a type having no projection optical system. In this case, the exposure light beam from the light source passes through the optical element, and the exposure light beam is radiated onto the liquid immersion area. For example, the present invention is also applicable to an exposure apparatus (lithography system) in which the substrate P is exposed with a line-and-space pattern by forming interference fringes on the substrate P as disclosed in International Publication No. 2001/035168.

The structure of the liquid immersion mechanism 100 including the nozzle member 70 and the like is not limited to those as described above, and may be modified within the scope of the present invention. For example, it is possible to adopt structures described in European Patent Publication No. 1420298 and International Publication Nos. 2004/055803, 2004/057589, 2004/057590, and 2005/029559.

The liquid LQ is water in the embodiment of the present invention. However, the liquid LQ may be any liquid other than water. For example, when the light source of the exposure light beam EL is the $F_2$ laser, the $F_2$ laser beam is not transmitted through water. Therefore, liquids preferably usable as the liquid LQ may include, for example, fluorine-based fluids such as fluorine-based oil and perfluoropolyether (PFPE) through which the $F_2$ laser beam is transmissive. In this case, a portion, which makes contact with the liquid LQ, is subjected to a liquid-attracting treatment by forming, for example, a thin film with a substance having a molecular structure containing fluorine having small polarity. Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL. In this case also, the surface treatment is performed depending on the polarity of the liquid LQ to be used. It is also possible to use various fluids having desired refractive indexes including, for example, supercritical fluids, gases having high refractive indexes and the like, in place of pure water as the liquid LQ.

The substrate P, which is usable in the respective embodiments described above, is not limited to the semiconductor wafer for producing the semiconductor device. Applicable substrates include, for example, a glass substrate for the display device, a ceramic wafer for the thin film magnetic head, and a master plate (synthetic silica glass, silicon wafer) for the mask or the reticle to be used for the exposure apparatus. In the embodiment described above, the light-transmissive type mask (reticle) is used, in which a predetermined light-shielding pattern (or phase pattern, light-reducing (dimming) pattern or the like) is formed on the light-transmissive substrate. However, in place of such a reticle, as disclosed, for example, in U.S. Pat. No. 6,778,257, it is also allowable to use an electronic mask on which a transmissive pattern, a reflective pattern, or a light-emitting pattern is formed based on an electronic data of the pattern to be subjected to the exposure.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P, as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to an exposure apparatus based on the system in which the full field exposure is performed on the substrate P by using a projection optical system (for example, the dioptric type projection optical system having a reduction magnification of ⅛ and including no catoptric element) with a reduction image of a first pattern in a state in which the first pattern and the substrate P are allowed to substantially stand still. In this case, the present invention is also applicable to the full field exposure apparatus based on the stitch system in which the full field exposure is further performed thereafter on the substrate P by partially overlaying a reduction image of a second pattern with respect to the first pattern by using the projection optical system in a state in which the second pattern and the substrate P are allowed to substantially stand still. As for the exposure apparatus based on the stitch system, the present invention is also applicable to the exposure apparatus based on the step-and-stitch system in which at least two patterns are partially overlaid and transferred on the substrate P, and the substrate P is successively moved.

The present invention is also applicable to a twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (PCT) (corresponding to U.S. Pat. No. 5,969,441), and U.S. Pat. No. 6,208,407, contents of which are incorporated herein by reference within a range of permission of the domestic laws and ordinances of the state designated or selected in this international application.

The present invention is also applicable to an exposure apparatus including the substrate stage which holds the substrate P and the measuring stage which carries various photoelectric sensors and reference members formed with reference marks, as disclosed in Japanese Patent Application Laid-open No. 11-135400. In this case, when the liquid immersion area is formed on the measuring stage, it is desirable to adjust the position and/or the inclination of the nozzle member (70, 72) depending on a position of the upper surface of the measuring stage.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type using the air bearing and those of the magnetic floating type using the Lorentz's force or the reactance force. Each of the stages PST, MST may be either of a type in which the movement is effected along a guide or of a guileless type in which no guide is provided. An example using the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to each other, and each of the stages PST, MST is driven by the electromagnetic force. In this case, any one of the magnet unit and the armature unit may be connected to the stage PST, MST, and the other of the magnet unit and the armature unit may be provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL, as described in Japanese Patent Application Laid-open No. 8-166475 (U.S. Pat. No. 5,528,118). The contents of U.S. Pat. No. 5,528,118 are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL, as described in Japanese Patent Application Laid-open No. 8-330224 (U.S. Pat. No. 5,874,820). The contents of U.S. Pat. No. 5,874,820 is incorporated herein by reference within a range of permission of the domestic laws and ordinances of the state designated or selected in this international application.

As described above, the exposure apparatus EX according to the embodiments of the present invention is produced by assembling the various subsystems including the respective constitutive elements as defined in claims so that the predetermined mechanical accuracy, electric accuracy, and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness and the like are managed.

Figure 17:
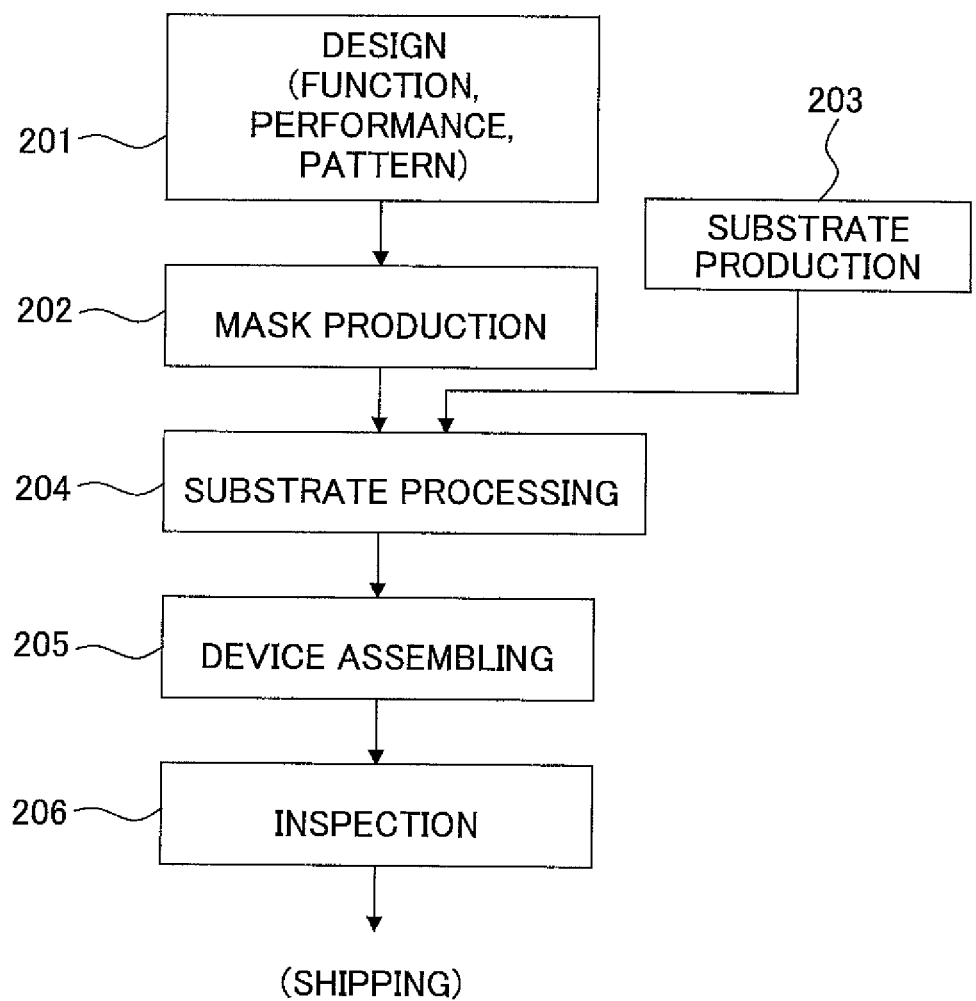
FIG. 17 shows a flow chart illustrating exemplary steps of producing a microdevice.

As shown in FIG. 17, a microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate processing step 204 of exposing the substrate with a pattern of the mask by using the exposure apparatus EX of the embodiment described above, a step 205 of assembling the device (including processing steps such as a dicing step, a bonding step, and a packaging step), and an inspection step 206. The substrate processing step 204 includes the process for adjusting the nozzle member as explained in the embodiments described above and the process for developing the substrate.

INDUSTRIAL APPLICABILITY

According to the present invention, the liquid can be satisfactorily retained on the substrate, and the substrate can be exposed highly accurately with the fine pattern. Therefore, it is possible to produce the high density device having the desired performance.

The invention claimed is:

1. An exposure apparatus which exposes a substrate, the exposure apparatus comprising:
   a projection system having a final optical element;
   a holding member configured to hold the final optical element;
   a first nozzle member having a liquid supply port from which immersion liquid is supplied;
   a second nozzle member having a liquid recovery port from which the supplied immersion liquid is recovered, the second nozzle member being movable relative to the first nozzle member;
   a driving system having an actuator by which the second nozzle member is moved relative to the first nozzle member and the projection system in a direction perpendicular to an optical axis of the final optical element; and
   a measuring device which obtains positional information of the second nozzle member.

2. The apparatus according to claim 1, wherein
   the driving system moves the second nozzle member in at least one direction of (i) a direction parallel to the optical axis of the final optical element, (ii) a rotational direction around an axis parallel to the optical axis, and (iii) a direction around an axis perpendicular to the optical axis.

3. The apparatus according to claim 1, wherein
   the liquid supply port is provided at the first nozzle member such that an upper surface of the substrate faces the liquid supply port when the substrate is under the first nozzle member.

4. The apparatus according to claim 1, wherein
   the liquid recovery port is provided at the second nozzle member such that an upper surface of the substrate faces the liquid recovery port in a case that the substrate is under the second nozzle member.

5. The apparatus according to claim 1, further comprising a support member by which the second nozzle member is supported.

6. The apparatus according to claim 1, wherein
   the driving system moves the second nozzle member based on the positional information of the second nozzle member obtained using the measuring device.

7. A device manufacturing method comprising:
   exposing a substrate using the apparatus according to claim 1; and
   processing the exposed substrate.

8. The apparatus according to claim 1, wherein
   movement of the second nozzle member by the actuator does not cause movement of the first nozzle member.

9. The apparatus according to claim 1, wherein
   the first nozzle member and the second nozzle member are disjoined from each other.

* * * * *